US012506468B2

(12) United States Patent
Kim et al.

(10) Patent No.: US 12,506,468 B2
(45) Date of Patent: Dec. 23, 2025

(54) DATA FLIP-FLOP CIRCUIT OF NONVOLATILE MEMORY DEVICE AND NONVOLATILE MEMORY DEVICE INCLUDING THE SAME

(71) Applicant: SAMSUNG ELECTRONICS CO., LTD., Suwon-si (KR)

(72) Inventors: Joonyoung Kim, Suwon-si (KR); Sanglok Kim, Suwon-si (KR); Jungjune Park, Suwon-si (KR); Chiweon Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 18/239,589

(22) Filed: Aug. 29, 2023

(65) Prior Publication Data

US 2024/0204760 A1 Jun. 20, 2024

(30) Foreign Application Priority Data

Dec. 20, 2022 (KR) ........................ 10-2022-0179028

(51) Int. Cl.

| | |
|---|---|
| ***H03K 3/35*** | (2006.01) |
| ***G11C 16/04*** | (2006.01) |
| ***G11C 16/10*** | (2006.01) |
| ***G11C 16/26*** | (2006.01) |
| ***G11C 16/32*** | (2006.01) |
| ***H03K 3/3562*** | (2006.01) |

(52) U.S. Cl.

CPC ..... *H03K 3/35625* (2013.01); *G11C 16/0483* (2013.01); *G11C 16/10* (2013.01); *G11C 16/26* (2013.01); *G11C 16/32* (2013.01)

(58) Field of Classification Search

CPC ....................... H03K 3/35625; G11C 16/0483; G11C 16/10; G11C 16/26; G11C 16/32

See application file for complete search history.

(56) References Cited

U.S. PATENT DOCUMENTS

| | | | |
|---|---|---|---|
| 7,391,250 | B1 | 6/2008 | Chuang |
| 7,616,041 | B2 | 11/2009 | Frederick, Jr. et al. |
| 7,948,263 | B2 | 5/2011 | Kim et al. |
| 8,242,826 | B2 | 8/2012 | Chi et al. |
| 9,425,771 | B2 | 8/2016 | Nandi et al. |
| 9,728,241 | B2 | 8/2017 | Ghosh et al. |
| 10,056,882 | B2 | 8/2018 | Nandi et al. |
| 10,608,615 | B2 | 3/2020 | Kim et al. |
| 11,387,817 | B2 | 7/2022 | Kang et al. |

(Continued)

*Primary Examiner* — Daniel C Puentes

(74) *Attorney, Agent, or Firm* — Sughrue Mion, PLLC

(57) ABSTRACT

A data flip-flop circuit includes a flip-flop, a recovery latch and a cut-off transistor. The flip-flop stores a data signal that is input, using a clock signal and a virtual power supply voltage and provides the stored data signal as an output signal at an output node in response to a rising transition of the clock signal. The recovery latch is connected to a power supply voltage and a ground voltage, is connected to the flip-flop at the output node, stores the output signal internally in response to a first transition of a chip enable signal, recovers the stored output signal in response to end of a power gating interval based on the chip enable signal, and provides the recovered output signal to the flip-flop. The cut-off transistor floats the virtual power supply voltage provided to the flip-flop based on a first power gating signal.

12 Claims, 26 Drawing Sheets

400a

(56) References Cited

U.S. PATENT DOCUMENTS

| | | | | |
|---|---|---|---|---|
| 2006/0291110 | A1 * | 12/2006 | Kanno | H01L 23/50<br>257/E27.11 |
| 2015/0138905 | A1 * | 5/2015 | Jayapal | H03K 19/003<br>326/94 |

* cited by examiner

10

500

400a

420

460

460

460

DATA FLIP-FLOP CIRCUIT OF NONVOLATILE MEMORY DEVICE AND NONVOLATILE MEMORY DEVICE INCLUDING THE SAME

CROSS-REFERENCE TO RELATED APPLICATION

This application claims priority under 35 U.S.C. § 119 to Korean Patent Application No. 10-2022-0179028, filed on Dec. 20, 2022, in the Korean Intellectual Property Office, the disclosure of which is incorporated by reference herein in its entirety.

BACKGROUND

1. Technical Field

Example embodiments generally relate to semiconductor memory devices, and more particularly to data flip-flop circuits of nonvolatile memory devices and nonvolatile memory devices including the same.

2. Discussion of the Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices of three-dimensional structure such as a vertical NAND memory devices have been developed to increase integration degree and memory capacity of the nonvolatile memory devices.

In a nonvolatile memory device, power gating is used for reducing leakage current. When a power supply voltage is cut off, data in a flip-flop needs to be moved.

SUMMARY

On or more example embodiments may provide a data flip-flop circuit of a nonvolatile memory device, capable of recovering data automatically based on a chip enable signal and capable of preventing degradation of performance.

Further, one or more example embodiments may provide a nonvolatile memory device including the data flip-flop circuit.

According to an aspect of an example embodiment, a data flip-flop circuit of a nonvolatile memory device, includes: a flip-flop configured to: store a data signal that is input, using a clock signal and a virtual power supply voltage based on a power supply voltage, and provide the stored data signal as an output signal at an output node in response to a rising transition of the clock signal: a recovery latch, connected to the power supply voltage and a ground voltage and connected to the flip-flop at the output node, wherein the recovery latch is configured to: store the output signal internally in response to a first transition corresponding to a deactivation of a chip enable signal, recover the stored output signal in response to an end of a power gating interval based on a second transition corresponding to an activation of the chip enable signal, and provide the recovered output signal to the flip-flop; and a first cut-off transistor configured to float the virtual power supply voltage provided to the flip-flop based on a first power gating signal during the power gating interval, in response to the recovery latch storing the output signal.

According to an aspect of an example embodiment, a nonvolatile memory device includes: a memory cell array including a plurality of memory cells: a page buffer circuit connected to the memory cell array through a plurality of bit-lines: a data input/output (I/O) circuit configured to transmit/receive data to/from an external memory controller, the data I/O circuit being connected to the page buffer circuit through a plurality of data lines; and a control circuit configured to control the page buffer circuit and the data I/O circuit based on a command and a control signal from the external memory controller, wherein the page buffer circuit includes a plurality of first data flip-flop circuits connected to the plurality of data lines respectively, wherein the data I/O circuit includes a plurality of second data flip-flop circuits connected to the plurality of data lines respectively, wherein each of the plurality of first data flip-flop circuits and each of the plurality of second data flip-flop circuits is configured to: store a data signal that is input during a first activation interval of a chip enable signal, provide the stored data signal as an output signal at an output node in response to a rising transition of a clock signal, store the output signal during a deactivation interval of the chip enable signal, and recover the stored output signal in response to a transition to a second activation interval of the chip enable signal after the deactivation interval of the chip enable signal and provide the recovered output signal at the output node.

According to an aspect of an example embodiment, a nonvolatile memory device includes: a data flip-flop circuit disposed in a data transfer path of the nonvolatile memory device: and a control circuit configured to control the data flip-flop circuit, wherein the data flip-flop circuit includes: a flip-flop configured to a store data signal that is input, using a clock signal and a virtual power supply voltage based on a power supply voltage and configured to provide the stored data signal as an output signal at an output node in response to a rising transition of the clock signal: a recovery latch, connected to the power supply voltage and a ground voltage and connected to the flip-flop at the output node, configured to: store the output signal internally in response to a first transition to a deactivation of a chip enable signal, recover the stored output signal in response to an end of a power gating interval based on a second transition to an activation of the chip enable signal, and provide the recovered output signal to the flip-flop: a first cut-off transistor configured to float the virtual power supply voltage provided to the flip-flop based on a first power gating signal during the power gating interval, in response to the recovery latch storing the output signal; and a second cut-off transistor configured to float a virtual ground voltage provided to the flip-flop during the power gating interval, in response to a second power gating signal based on the first transition of the chip enable signal, the virtual ground voltage being based on the ground voltage, and wherein the control circuit includes: a timing controller configured to generate timing control signals for controlling the recovery latch based on a command, the first power gating signal and the chip enable signal, and a power gating controller configured to generate the first power gating signal and the second power gating signal based on the chip enable signal and the timing control signals.

According to one or more example embodiments, the data flip-flop circuit includes the flip-flop and the recovery latch which stores the output signal received from the flip-flop during a power gating based on the chip enable signal being performed on the flip-flop, recovers the stored output signal when the power gating interval ends, and provides the recovered output signal to the flip-flop. Therefore, data flip-flop circuit may ensure data retention during the power gating interval and may reduce stand-by current without degrading performance of the flip-flop.

BRIEF DESCRIPTION OF THE DRAWINGS

Illustrative, non-limiting example embodiments will be more clearly understood from the following detailed description in conjunction with the accompanying drawings, in which.

DETAILED DESCRIPTION

Various example embodiments will be described more fully hereinafter with reference to the accompanying drawings, in which some example embodiments are shown.

Figure 1:
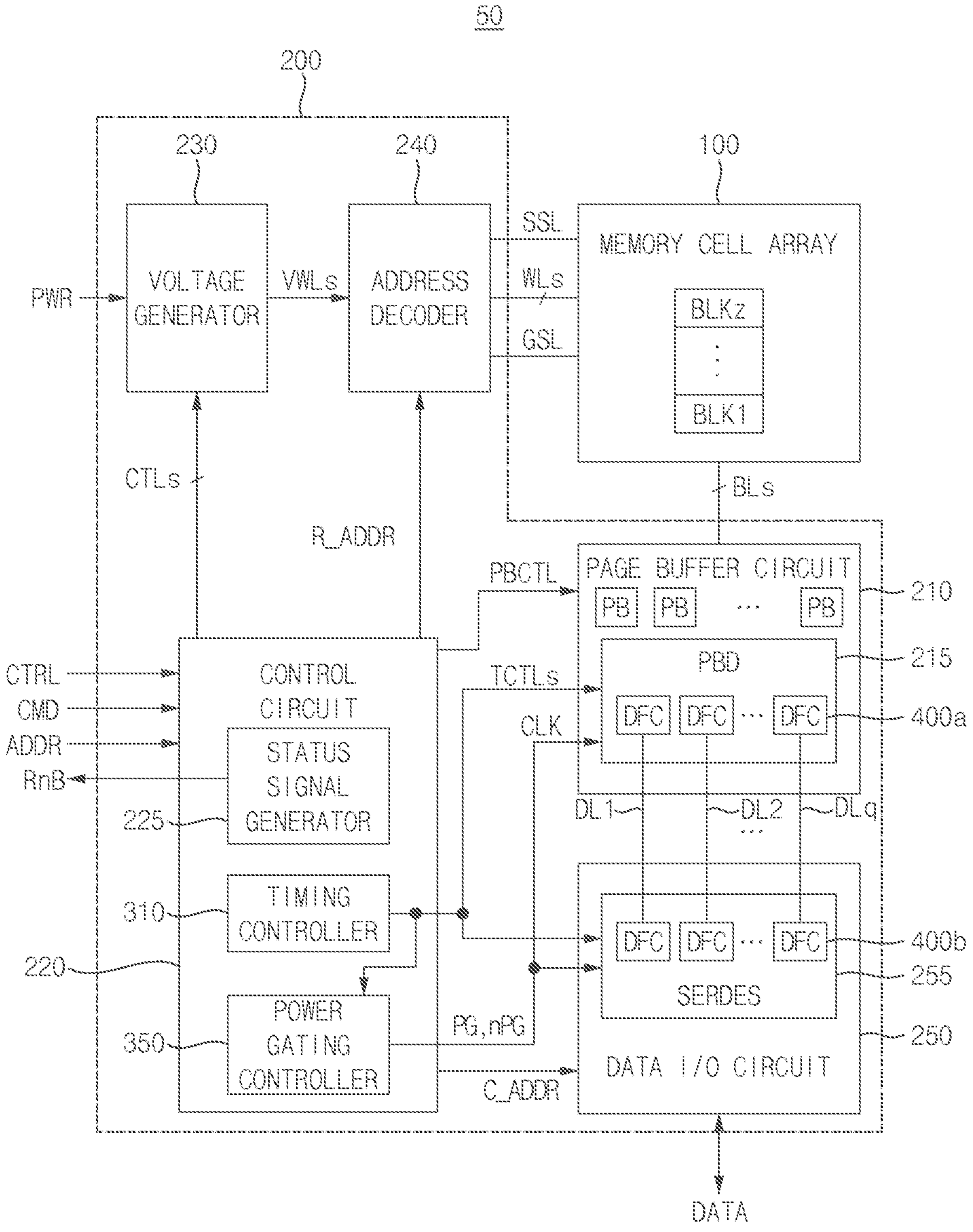
FIG. 1 is a block diagram of a nonvolatile memory device according to example embodiments.

FIG. 1 is a block diagram of a nonvolatile memory device according to example embodiments.

Referring to FIG. 1, a nonvolatile memory device 50 may include a memory cell array 100 and a peripheral circuit 200. The peripheral circuit 200 may include a page buffer circuit 210, a control circuit 220, a voltage generator 230, an address decoder 240, a data transfer circuit 300 and a data input/output (I/O) circuit 250. The peripheral circuit 200 may further include an I/O interface, a column logic, a pre-decoder, a temperature sensor, etc.

The memory cell array 100 may be coupled to the address decoder 240 through a string selection line SSL, a plurality of word-lines WLs, and a ground selection line GSL. In addition, the memory cell array 100 may be coupled to the page buffer circuit 210 through a plurality of bit-lines BLs. The memory cell array 100 may include a plurality of nonvolatile memory cells coupled to the plurality of word-lines WLs and the plurality of bit-lines BLs.

The memory cell array 100 may include a plurality of memory blocks BLK1 through BLKz, and each of the memory blocks BLK1 through BLKz may have a three-dimensional (3D) structure. Here, z is an integer greater than two. The memory cell array 100 may include a plurality of (vertical) cell strings and each of the cell strings includes a plurality of memory cells stacked with respect to each other.

The control circuit 220 may, receive a command CMD, an address ADDR, and a control signal CTRL from a memory controller (refer to 20 in FIG. 2) and may control an erase loop, a program loop and a read operation of the nonvolatile memory device 50 based on the command CMD, the address ADDR and the control signal CTRL.

In example embodiments, the control circuit 220 may generate control signals CTLs, which are used for controlling the voltage generator 230, based on the command CMD, may generate a page buffer control signal PBCTL for controlling the page buffer circuit 210, and may generate a row address R_ADDR and a column address C_ADDR based on the address ADDR. The control circuit 220 may provide the control signals CTLs to the voltage generator

230, may provide the page buffer control signal PBCTL to the page buffer circuit 210 may provide the row address R_ADDR to the address decoder 240 and may provide the column address C_ADDR to the data I/O circuit 250. The control circuit 220 may include a status signal generator 225 and the status signal generator 225 may generate a status signal RnB indicating an operating status of the nonvolatile memory device 50. The status signal RnB may be referred to as a ready/busy signal because of the status signal RnB indicates either busy state or a ready state of the nonvolatile memory device 50.

The address decoder 240 may be coupled to the memory cell array 100 through the string selection line SSL, the plurality of word-lines WLs, and the ground selection line GSL. During program operation or read operation, the address decoder 240 may determine one of the plurality of word-lines WLs as a selected word-line based on the row address R_ADDR and may determine rest of the plurality of word-lines WLs except the selected word-line as unselected word-lines.

The voltage generator 230 may generate word-line voltages VWLs associated with operations of the nonvolatile memory device 50 using a power PWR provided from the memory controller based on control signals CTLs from the control circuit 220. The word-line voltages VWLs may include a program voltage, a read voltage, a pass voltage, an erase verification voltage, or a program verification voltage. The word-line voltages VWLs may be applied to the plurality of word-lines WLs through the address decoder 240.

For example, during the erase operation, the voltage generator 230 may apply an erase voltage to a well of a selected memory block and may apply a ground voltage to all word-lines of the selected memory block. During the erase verification operation, the voltage generator 230 may apply an erase verification voltage to all word-lines of the selected memory block or may apply the erase verification voltage to the word-lines of the selected memory block by word-line basis.

For example, during the program operation, the voltage generator 230 may apply a program voltage to the selected word-line and may apply a program pass voltage to the unselected word-lines. In addition, during the program verification operation, the voltage generator 230 may apply a program verification voltage to the selected word-line and may apply a verification pass voltage to the unselected word-lines. In addition, during the read operation, the voltage generator 230 may apply a read voltage to the selected word-line and may apply a read pass voltage to the unselected word-lines.

The page buffer circuit 210 may be coupled to the memory cell array 100 through the plurality of bit-lines BLs. The page buffer circuit1 410 may include a plurality of page buffers PB and a page buffer driver (PBD) 215. During the program operation, the page buffer circuit 210 may temporarily store data to be programmed in a selected page or during the read operation, the page buffer circuit 210 may temporarily store data read out from the selected page of the memory cell array 100. The page buffer driver 251 may transfer data provided from the data I/O circuit 250 to the plurality of page buffers PB during the program operation, and may transfer data provided from the plurality of page buffers PB to the data I/O circuit 250.

Figure 9:
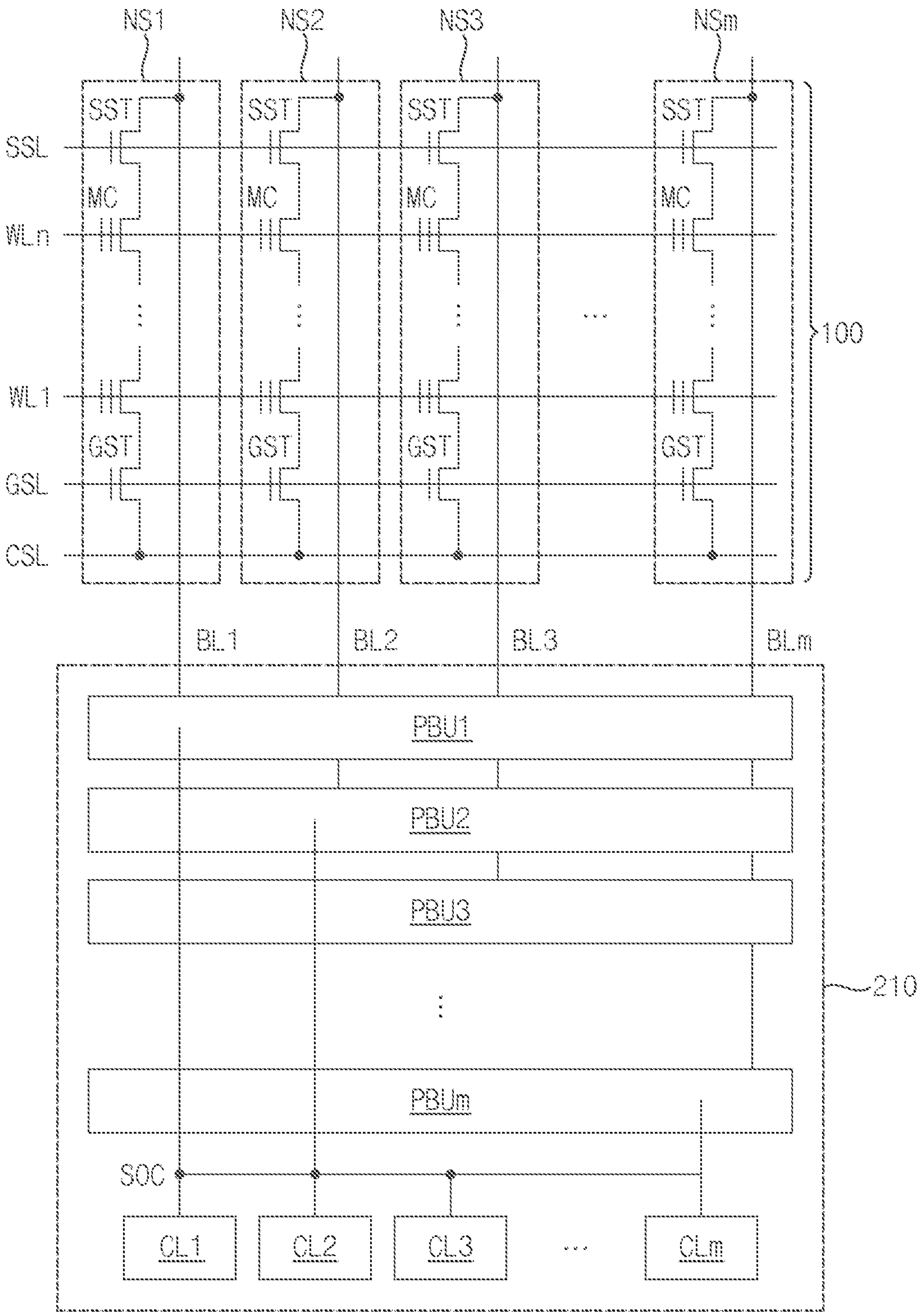
FIG. 9 is a schematic diagram of a connection of the memory cell array to the page buffer circuit in FIG. 1, according to example embodiments.

In example embodiments, page buffer units included in each of the plurality of page buffers PB (for example, first through m-th page buffer units PBU1 through PBUm in FIG. 9) and cache latches included in each of the plurality of page buffers PB (for example, first through m-th cache latches CL1 through CLm in FIG. 9) may be spaced apart from each other, and have separate structures. Accordingly, the degree of freedom of wirings on the page buffer units may be improved, and the complexity of a layout may be reduced. In addition, because the cache latches are adjacent to the data I/O lines, the distance between the cache latches and the data I/O lines may be reduced, and thus, data I/O speed may be improved.

The data I/O circuit 250 may be connected to page buffer circuit 210 through a plurality of data lines DL1, DL2, . . . , DLq. Here q is a natural number greater than two. During the program operation, the data I/O circuit 250 may receive program data DATA from the memory controller (20 in FIG. 2) and provide the program data DATA to the page buffer circuit 210 based on the column address C_ADDR received from the control circuit 220. During the read operation, the data I/O circuit 250 may receive the read data DATA from the page buffer circuit 210 based on the column address C_ADDR received from the control circuit 220 and may provide read data DATA to the memory controller 20.

The data I/O circuit 250 may include a serializer/deserializer (SERDES) 255. During the program operation, the SERDES 255 may parallelize the program data DATA to provide parallelized data to the page buffer circuit 210 and during the read operation, the SERDES 255 may serialize the read data DATA from the page buffer circuit 210 to provide serialized data to the memory controller 20.

The page buffer driver 215 may include a plurality of first data flip-flop circuits DFC 400*a* and the SERDES 255 may include a plurality of second data flip-flop circuits 400*b*.

The first data flip-flop circuits 400*a* may be connected to the data lines DL1, DL2, . . . , DLq respectively and the second data flip-flop circuits 400*b* may be connected to the data lines DL1, DL2, . . . , DLq respectively. Here, q is a natural number greater than two.

Each of the first data flip-flop circuits 400*a* and the second data flip-flop circuits 400*b* may a store data signal that is input during a first activation interval of a chip enable signal, may provide the stored data signal as an output signal at an output node in response to a rising transition of a clock signal, store the output signal during a deactivation interval of the chip enable signal, may recover the stored output signal in response to a transition to a second activation interval of the chip enable signal after the deactivation interval of the chip enable signal and may and provide the recovered output signal as the output signal at the output node.

The control circuit 220 may include a timing controller 310 and a power gating controller 350 that control the first data flip-flop circuits 400*a* and the second data flip-flop circuits 400*b*.

The timing controller 310 may generate timing control signals TCTLs for controlling operation timings of the first data flip-flop circuits 400*a* and the second data flip-flop circuits 400*b* based on the chip enable signal of the control signal CTRL and the command CMD. The timing control signals TCTLs may include a plurality of enable signals.

The power gating controller 350 may generate a first power gating signal nPG and a second power gating signal PG for controlling a power gating of each of the first data flip-flop circuits 400*a* and the second data flip-flop circuits 400*b* based on the chip enable signal of the control signal CTRL and the timing control signals TCTLs.

Figure 2:
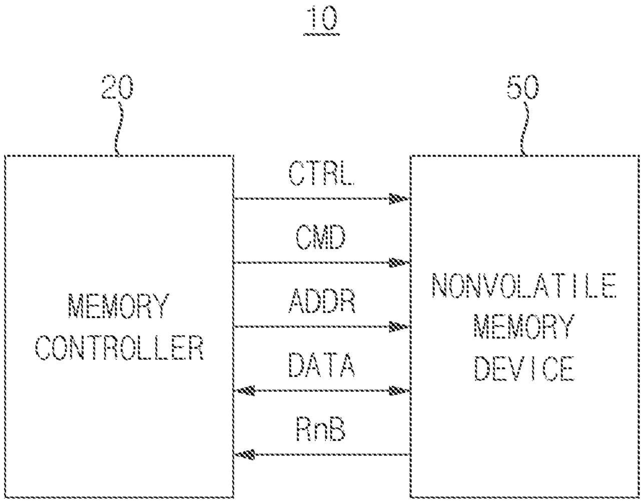
FIG. 2 is a block diagram illustrating a memory system including the nonvolatile memory device according to example embodiments.

FIG. 2 is a block diagram illustrating a memory system including the nonvolatile memory device of FIG. 1 according to example embodiments.

Referring to FIG. 2, a memory system 10 may include a memory controller 20 and the nonvolatile memory device NVM 50.

The memory controller 20 may control operation of the nonvolatile memory device 50 by applying the control signal CTRL, the command CMD and address ADDR to the nonvolatile memory device 50 and may exchange the data DATA with the nonvolatile memory device 50. The nonvolatile memory device 50 may provide the memory controller 20 with the status signal RnB indicating operating status of the nonvolatile memory device 50. For example, when the status signal RnB has a logic high level (ready state), the status signal RnB indicates that the nonvolatile memory device 50 is ready for receiving a command from the memory controller 20.

Figure 3:
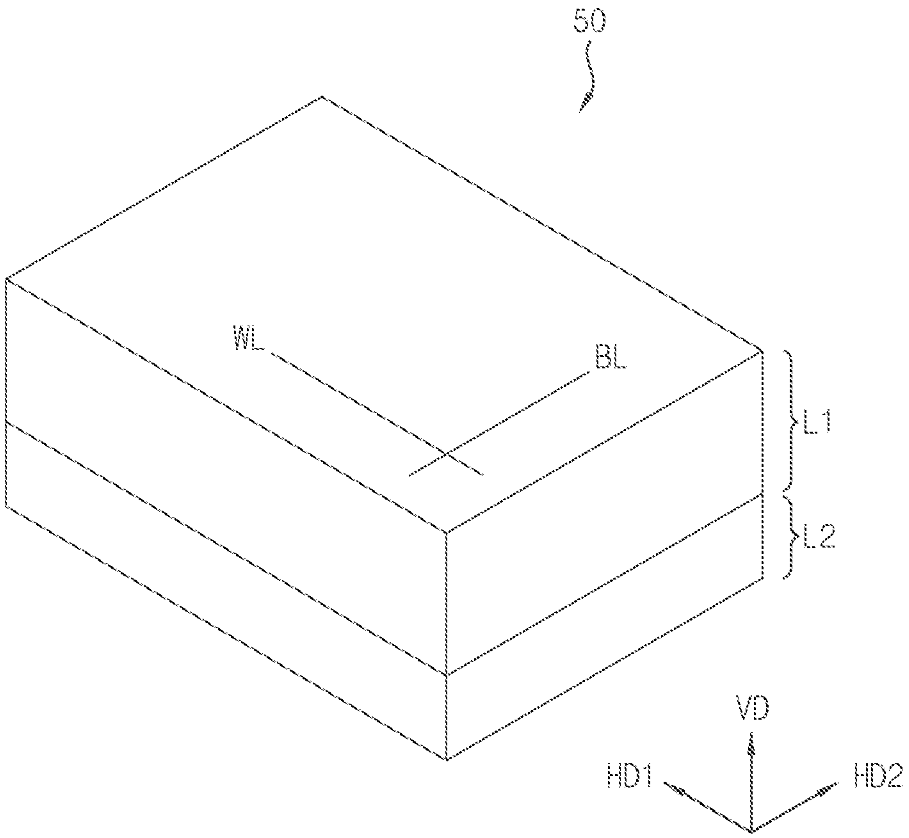
FIG. 3 schematically illustrates a structure of the non-volatile memory device of FIG. 1 according to example embodiments.

FIG. 3 schematically illustrates a structure of the nonvolatile memory device of FIG. 1 according to example embodiments.

Referring to FIG. 3, the nonvolatile memory device 50 may include a first semiconductor layer L1 and a second semiconductor layer L2, and the first semiconductor layer L1 may be stacked in a vertical direction VD with respect to the second semiconductor layer L2. The second semiconductor layer L2 may be under the first semiconductor layer L1 in the vertical direction VD, and accordingly, the second semiconductor layer L2 may be close to a substrate.

In example embodiments, the memory cell array 100 in FIG. 1 may be formed (or, provided) on the first semiconductor layer L1, and the peripheral circuit 200 in FIG. 1 may be formed (or, provided) on the second semiconductor layer L2. Accordingly, the nonvolatile memory device 50 may have a structure in which the memory cell array 100 is on the peripheral circuit 200, that is, a cell over periphery (COP) structure. The COP structure may effectively reduce an area in a horizontal direction and improve the degree of integration of the nonvolatile memory device 50.

In example embodiments, the second semiconductor layer L2 may include the substrate, and by forming transistors on the substrate and metal patterns for wiring transistors, the peripheral circuit 200 may be formed in the second semiconductor layer L2. After the peripheral circuit 200 is formed on the second semiconductor layer L2, the first semiconductor layer L1 including the memory cell array 100 may be formed, and the metal patterns for connecting the word-lines WL and the bit-lines BL of the memory cell array 100 to the peripheral circuit 200 formed in the second semiconductor layer L2 may be formed. For example, the word-lines WL may extend in a first horizontal direction HD1 and the bit-lines BL may extend in a second horizontal direction HD2.

As the number of stages of memory cells in the memory cell array 100 increases with the development of semiconductor processes, that is, as the number of stacked word-lines WL increases, an area of the memory cell array 100 may decrease, and accordingly, an area of the peripheral circuit 200 may also be reduced. According to example embodiments, to reduce an area of a region occupied by the page buffer circuit 210, the page buffer circuit 210 may have a structure in which the page buffer unit and the cache latch are separated from each other, and may connect sensing nodes included in each of the page buffer units commonly to a combined sensing node.

Figure 4:
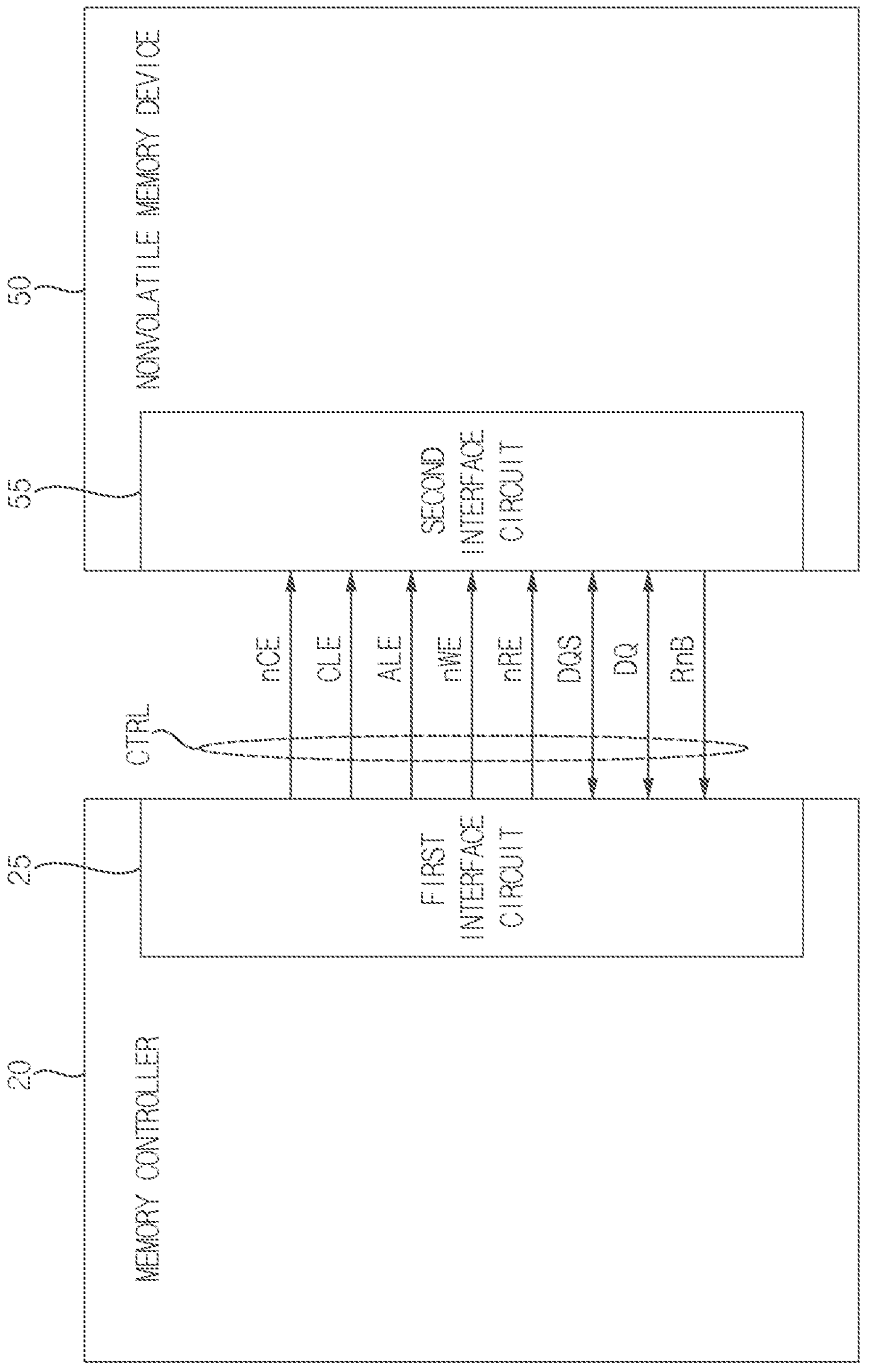
FIG. 4 illustrates an interface of the memory system of FIG. 2 according to example embodiments.

FIG. 4 illustrates an interface of the memory system of FIG. 2 according to example embodiments.

Referring to FIG. 4, the memory system 10 includes the memory controller 20 and the nonvolatile memory device 50, the memory controller 20 may include a first interface circuit 25 and the nonvolatile memory device 50 may include a second interface circuit 55.

The second interface circuit 55 may receive a chip enable signal nCE from the memory controller 20. The second interface circuit 55 may transmit and receive signals to and from the memory controller 20 in response to the chip enable signal nCE being in an enable state (e.g., a low level).

The second interface circuit 55 may receive a command latch enable signal CLE, an address latch enable signal ALE and a write enable signal nWE from the memory controller 20. The second interface circuit 55 may receive a data signal DQ and a data strobe signal DQS from the memory controller 20 or may transmit the data signal DQ and the data strobe signal DQS to the memory controller 20.

The second interface circuit 55 may transmit a status signal RnB to the memory controller 20.

The second interface circuit 55 may obtain the command CMD from the data signal DQ, which is received in an enable section (e.g., a high-level state) of the command latch enable signal CLE based on toggle time points of the write enable signal nWE. The second interface circuit 55 may obtain the address ADDR from the data signal DQ, which is received in an enable section (e.g., a high-level state) of the address latch enable signal ALE based on the toggle time points of the write enable signal nWE.

In some example embodiments, the write enable signal nWE may be maintained at a static state (e.g., a high level or a low level) and may toggle between the high level and the low level. For example, the write enable signal nWE may toggle in a section in which the command CMD or the address ADDR is transmitted. Thus, the second interface circuit 55 may obtain the command CMD or the address ADDR based on the toggle time points of the write enable signal nWE.

In a data output operation of the nonvolatile memory device 50, the second interface circuit 55 may receive the read enable signal nRE which toggles. The second interface circuit 55 may generate the data strobe signal DQS, which toggles based on the toggling of the read enable signal nRE. For example, the second interface circuit 55 may generate the data strobe signal DQS, which starts toggling after a predetermined delay, based on a toggling start time of the read enable signal nRE. The second interface circuit 55 may transmit the data signal DQ including the data DATA based on a toggle time point of the data strobe signal DQS. Thus, the data DATA may be aligned with the toggle time point of the data strobe signal DQS and may be transmitted to the memory controller 20.

In a data input operation of the nonvolatile memory device 50, when the data signal DQ including the data DATA is received from the memory controller 20, the second interface circuit 55 may receive the data strobe signal DQS, which toggles, along with the data DATA from the memory controller 20. The second interface circuit 55 may obtain the data DATA from the data signal DQ based on toggle time points of the data strobe signal DQS. For example, the second interface circuit 55 may sample the data signal DQ at rising and falling edges of the data strobe signal DQS and may obtain the data DATA.

The second interface circuit 55 may transmit the status signal RnB to the memory controller 20. The second interface circuit 55 may transmit state information of the nonvolatile memory device 50 through the status signal RnB to the memory controller 20. When the nonvolatile memory device 50 is in a busy state (e.g., when operations are being performed in the nonvolatile memory device 50), the second interface circuit 55 may transmit the status signal RnB indicating the busy state to the memory controller 20. When the nonvolatile memory device 50 is in a ready state (e.g., when operations are not performed or are completed in the nonvolatile memory device 50), the second interface circuit 55 may transmit the status signal RnB indicating the ready state to the memory controller 20.

Figure 5:
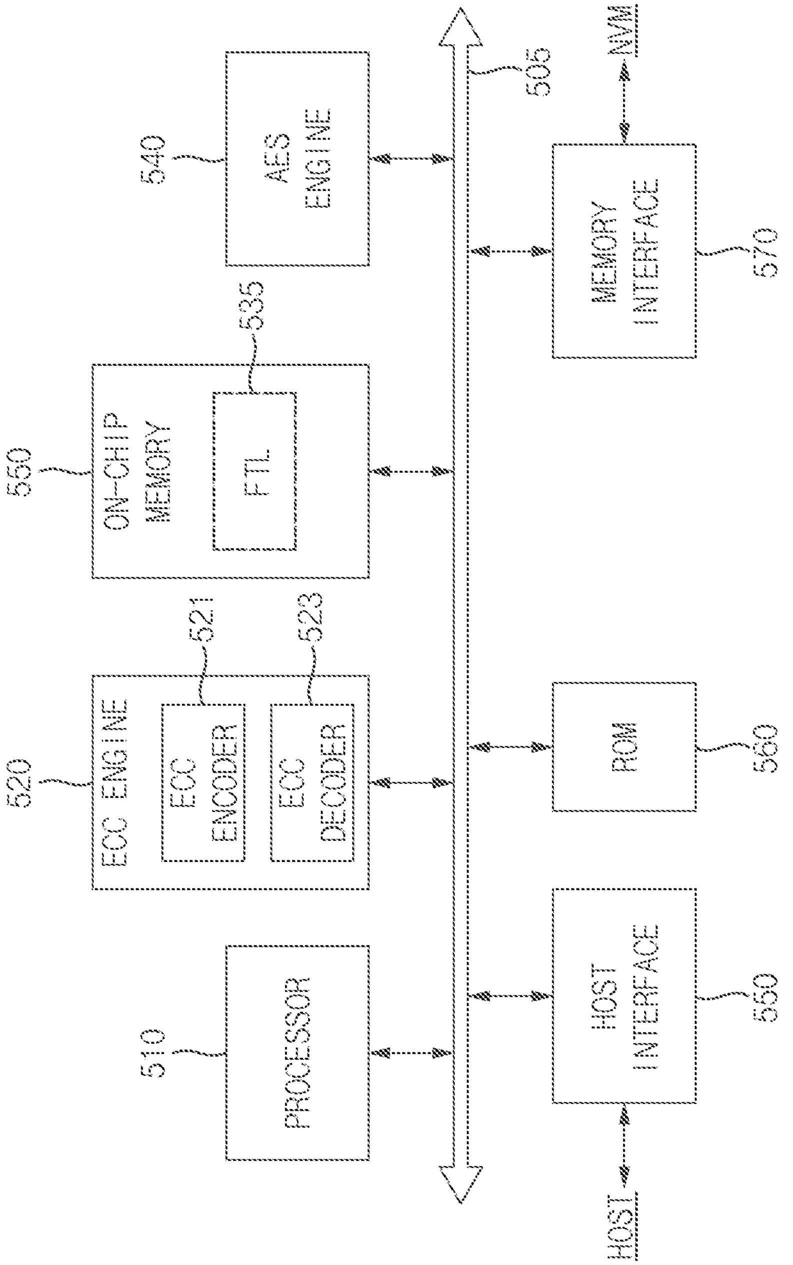
FIG. 5 is a block diagram illustrating an example of a memory controller according to example embodiments.

FIG. 5 is a block diagram illustrating an example of a memory controller according to example embodiments.

Referring to FIG. 5, a memory controller 500 may include a processor 510, an error correction code (ECC) engine 520, an on-chip memory 530, an advanced encryption standard (AES) engine 540, a host interface 550, a ROM 560 and a memory interface 570 which are connected via a bus 505.

The processor 510 controls an overall operation of the memory controller 500. The processor 510 may control the ECC engine 520, the on-chip memory 530, the AES engine 540, the host interface 550, the ROM 560 and the memory interface 570. The processor 510 may include one or more cores (e.g., a homogeneous multi-core or a heterogeneous multi-core). The processor 510 may be or include, for example, at least one of a central processing unit (CPU), an image signal processing unit(ISP), a digital signal processing unit (DSP), a graphics processing unit(GPU), a vision processing unit (VPU), and a neural processing unit(NPU). The processor 510 may execute various application programs (e.g., a flash translation layer (FTL) 535 and firmware) loaded onto the on-chip memory 530.

The on-chip memory 530 may store various application programs that are executable by the processor 510. The on-chip memory 530 may operate as a cache memory adjacent to the processor 510. The on-chip memory 530 may store a command, an address, and data to be processed by the processor 510 or may store a processing result of the processor 510. The on-chip memory 530 may be, for example, a storage medium or a working memory including a latch, a register, a static random access memory(SRAM), a dynamic random access memory (DRAM), a thyristor random access memory (TRAM), a tightly coupled memory (TCM), etc.

The processor 510 may execute the FTL 535 loaded onto the on-chip memory 530. The FTL 535 may be loaded onto the on-chip memory 530 as firmware or a program stored in the nonvolatile memory device 50. The FTL 535 may manage mapping between a logical address provided from the host and a physical address of the nonvolatile memory device 50 and may include an address mapping table manager managing and updating an address mapping table. The FTL 535 may further perform a garbage collection operation, a wear leveling operation, and the like, as well as the address mapping described above. The FTL 535 may be executed by the processor 510 for addressing one or more of the following aspects of the nonvolatile memory device 50: overwrite- or in-place write-impossible, a life time of a memory cell, a limited number of program-erase (PE) cycles, and an erase speed slower than a write speed.

Memory cells of the nonvolatile memory device 50 may have the physical characteristic that a threshold voltage distribution varies due to causes, such as a program elapsed time, a temperature, program disturbance, read disturbance and etc. For example, data stored at the nonvolatile memory device 50 becomes erroneous due to the above causes.

The memory controller 500 may utilize a variety of error correction techniques to correct such errors. For example, the memory controller 500 may include the ECC engine 520. The ECC engine 520 may correct errors which occur in the data stored in the nonvolatile memory device 50. The ECC engine 520 may include an ECC encoder 521 and an ECC decoder 523. The ECC encoder 521 may perform an ECC encoding operation on data to be stored in the nonvolatile memory device 50. The ECC decoder 523 may perform an ECC decoding operation on data read from the nonvolatile memory device 50.

The ROM 560 may store a variety of information, needed for the memory controller 500 to operate, in firmware.

The AES engine 540 may perform at least one of an encryption operation and a decryption operation on data input to the memory controller 500 by using a symmetric-key algorithm. The AES engine 540 may include an encryption module and a decryption module. For example, the encryption module and the decryption module may be implemented as separate modules. For another example, one module capable of performing both encryption and decryption operations may be implemented in the AES engine 540.

The memory controller 500 may communicate with a host through the host interface 550. For example, the host interface 550 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The memory controller 500 may communicate with a nonvolatile memory device NVM such as the nonvolatile memory device 50 through the memory interface 570.

Figure 6:
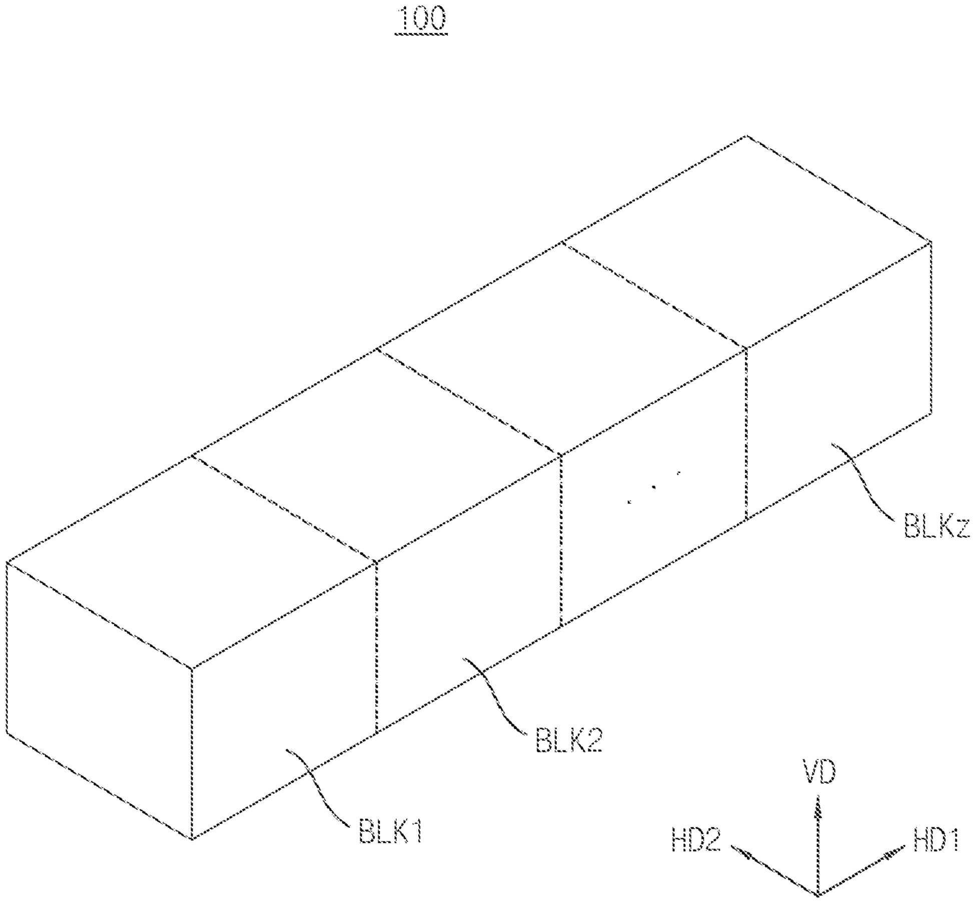
FIG. 6 is a block diagram illustrating an example of the memory cell array in FIG. 1 according to example embodiments.

FIG. 6 is a block diagram illustrating an example of the memory cell array in FIG. 1 according to example embodiments.

Referring to FIG. 6, the memory cell array 100 may include a plurality of memory blocks BLK1 to BLKz which extend along a plurality of directions HD1, HD2 and VD. The plurality of directions HD1, HD2 and VD may include a first horizontal direction HD1, a second horizontal direction HD2 and a vertical direction VD. In an embodiment, the memory blocks BLK1 to BLKz are selected by the address decoder 240 in FIG. 1. For example, the address decoder 240 may select a memory block BLK corresponding to a block address among the memory blocks BLK1 to BLKz.

Figure 7:
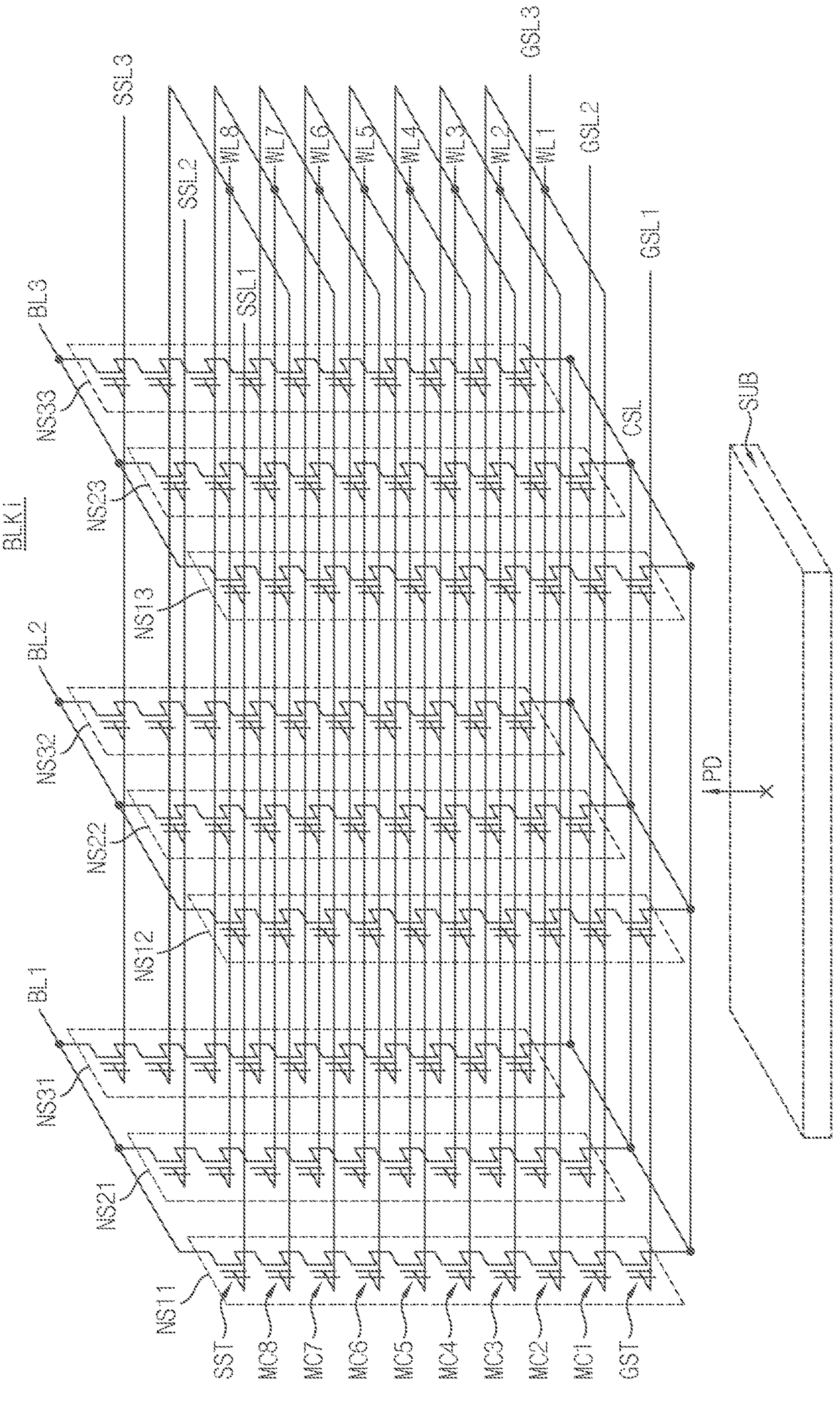
FIG. 7 is a circuit diagram illustrating one of the memory blocks of FIG. 6.

FIG. 7 is a circuit diagram illustrating one of the memory blocks of FIG. 6.

The memory block BLK1 of FIG. 7 may be formed on a substrate SUB in a three-dimensional structure (or a vertical structure). Here, i may be one of 1 to z. For example, a plurality of memory cell strings included in the memory block BLKi may be formed in a direction PD perpendicular to the substrate SUB. The direction PD may correspond to the vertical direction VD in FIG. 6.

Referring to FIG. 7, the memory block BLKi may include (memory) cell strings NS11, NS21, NS31, NS12, NS22, NS32, NS13, NS23 and NS33 coupled between bit-lines BL1, BL2 and BL3 and a common source line CSL. Each of the memory cell strings NS11, NS21, NS31, NS12, NS22, NS32, NS13, NS23 and NS33 may include a string selection transistor SST, a plurality of memory cells MC1, MC2, MC3, MC4, MC6, MC7 and MC8, and a ground selection transistor GST. In FIG. 7, each of the memory cell strings NS11, NS21, NS31, NS12, NS22, NS32, NS13, NS23 and NS33 is illustrated to include eight memory cells MC1, MC2, MC3, MC4, MC6, MC7 and MC8. However, example embodiments are not limited thereto. In some example embodiments, each of the cell strings NS11, NS21, NS31, NS12, NS22, NS32, NS13, NS23 and NS33 may include any number of memory cells.

The string selection transistor SST may be connected to corresponding string selection lines SSL1, SSl2 and SSL3. The plurality of memory cells MC1, MC2, MC3, MC4, MC6, MC7 and MC8 may be connected to corresponding word-lines WL1, WL2, WL3, WL5, WL5, WL6, WL7 and WL8, respectively. The ground selection transistor GST may be connected to corresponding ground selection lines GSL1, GSL2 and GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1, GSL2 and GSL3 and the string selection lines SSL1, SSl2 and SSL3 may be separated.

Figure 8:
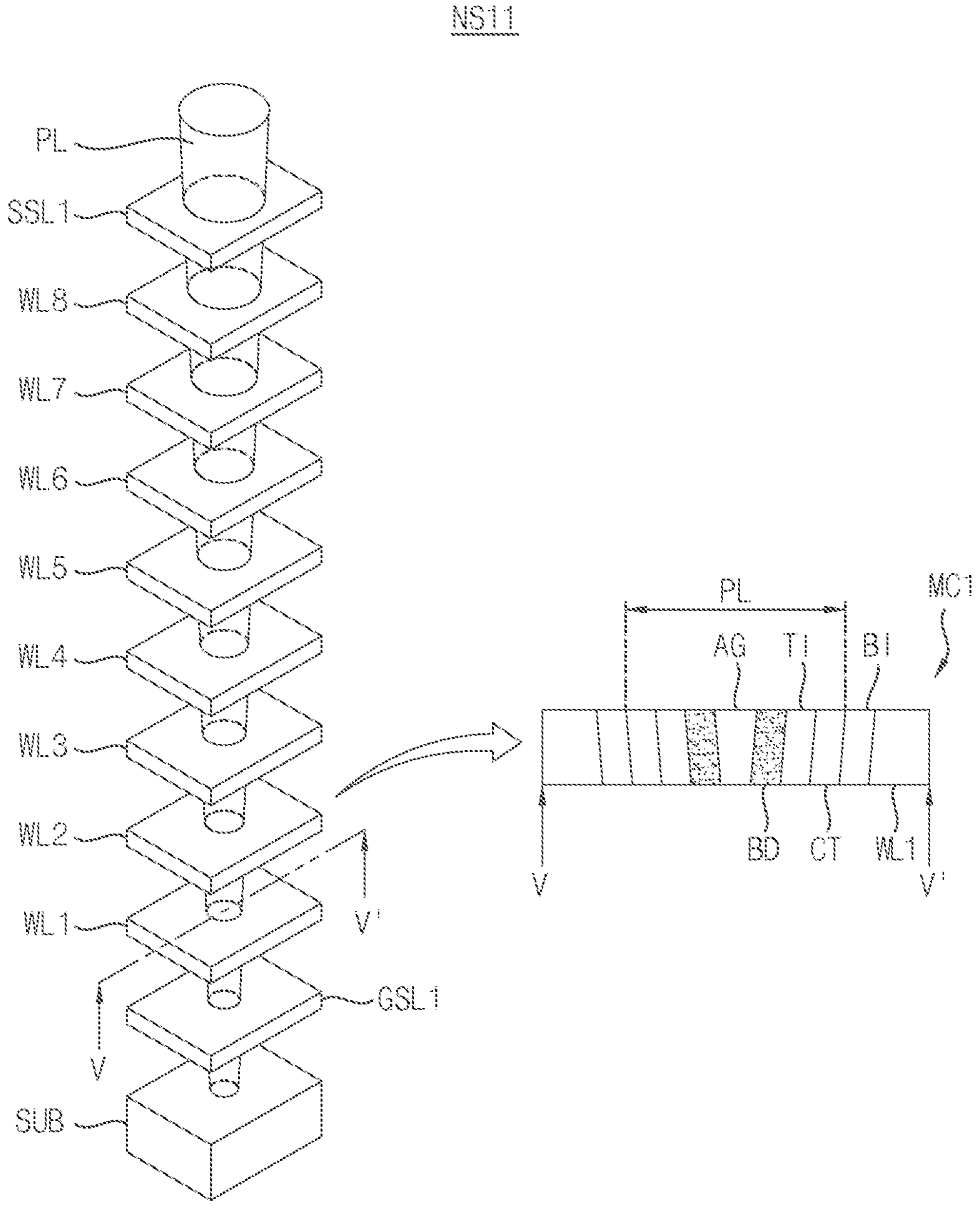
FIG. 8 illustrates an example of a structure of a cell string NS11 in the memory block of FIG. 7.

FIG. 8 illustrates an example of a structure of a cell string NS11 in the memory block of FIG. 7.

Referring to FIGS. 7 and 8, a pillar PL is provided on the substrate SUB such that the pillar PL extends in a direction perpendicular to the substrate SUB to make contact with the substrate SUB. Each of the ground selection line GSL, the word lines WL1 to WL8, and the string selection lines SSL illustrated in FIG. 8 may be formed of a conductive material parallel with the substrate SUB, for example, a metallic material. The pillar PL may be in contact with the substrate SUB through the conductive materials forming the string selection lines SSL1, the word lines WL1 to WL8, and the ground selection line GSL1.

A sectional view taken along a line V-V' is also illustrated in FIG. 8. In some example embodiments, a sectional view of a first memory cell MC1 corresponding to a first word line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

FIG. 9 is a schematic diagram of a connection of the memory cell array to the page buffer circuit in FIG. 1, according to example embodiments.

Referring to FIG. 9, the memory cell array 100 may include first through m-th cell strings NS1 through NSm, each of the first through m-th cell strings NS1 through NSm may include a ground select transistor GST connected to the ground select line GSL, a plurality of memory cells MC respectively connected to the first through n-th word-lines WL1 through WLn, and a string select transistor SST connected to the string select line SSL, and the ground select transistor GST, the plurality of memory cells MC, and the string select transistor SST may be connected to each other in series. In this case, n may be a positive integer.

The page buffer circuit 210 may include first through m-th page buffer units PBU1 through PBUm. The first page buffer unit PB1 may be connected to the first cell string NS1 via the first bit-line BL1, and the m-th page buffer unit PBUm may be connected to the m-th cell string NSm via the m-th bit-line BLm. For example, m may be 8, and the page buffer circuit 210 may have a structure in which page buffer units of eight stages, or, the first through m-th page buffer units PBU1 through PBUm are in a line. For example, the first through m-th page buffer units PBU1 through PBUm may be in a row in an extension direction of the first through m-th bit-lines BL1 through BLm.

The page buffer circuit 210 may further include first through m-th cache latches CL1 through CLm respectively corresponding to the first through m-th page buffer units PBU1 through PBUm. For example, the page buffer circuit 210 may have a structure in which the cache latches of eight stages or the first through m-th cache latches CL1 through CLm in a line. For example, the first through m-th cache latches CL1 through CLm may be in a row in an extension direction of the first through m-th bit-lines BL1 through BLm.

The sensing nodes of each of the first through m-th page buffer units PBU1 through PBUm may be commonly connected to a combined sensing node SOC. In addition, the first through m-th cache latches CL1 through CLm may be commonly connected to the combined sensing node SOC. Accordingly, the first through m-th page buffer units PBU1 through PBUm may be connected to the first through m-th cache latches CL1 through CLm via the combined sensing node SOC.

Figure 10:
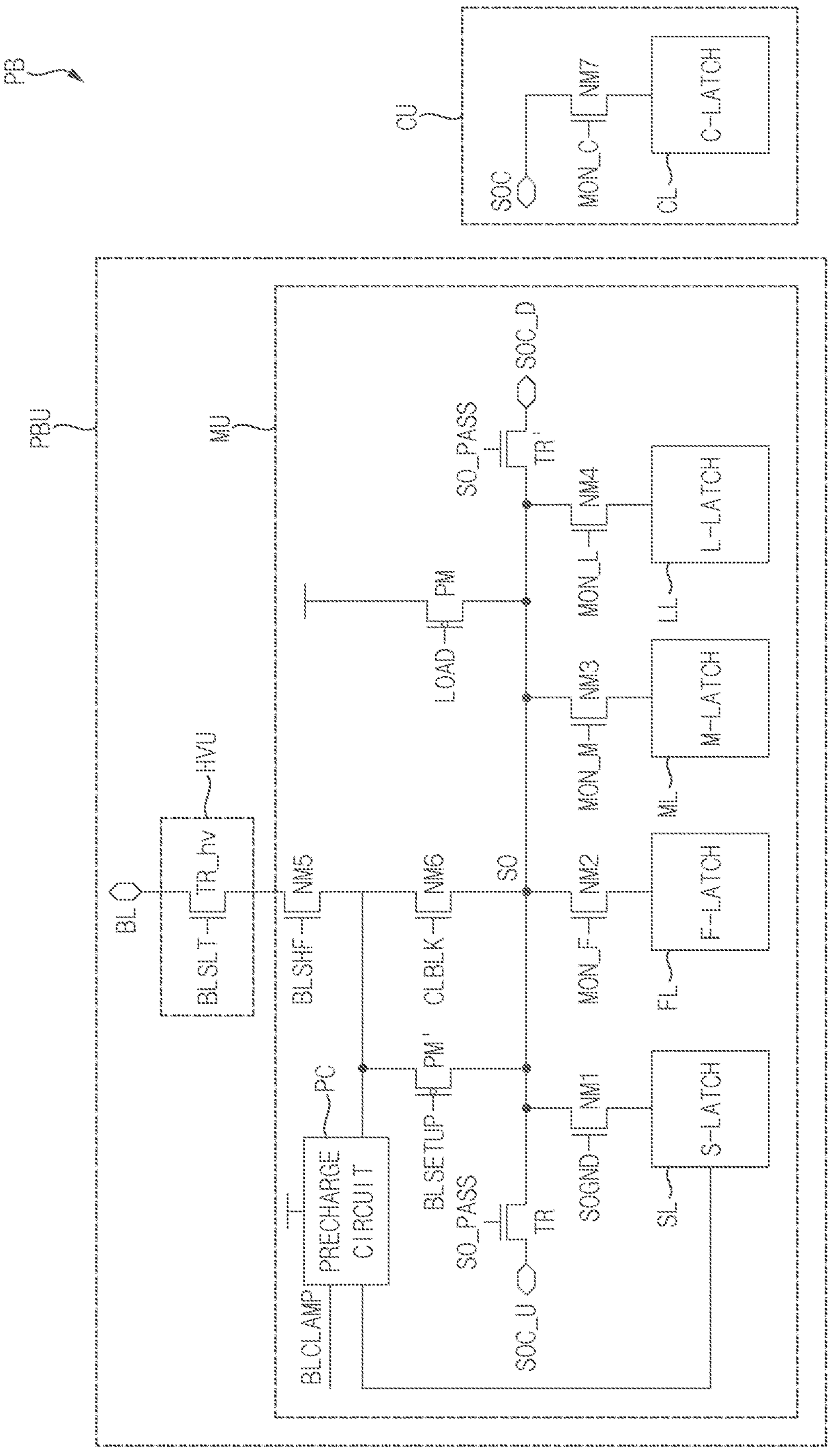
FIG. 10 illustrates in detail a page buffer according to example embodiments.

FIG. 10 illustrates in detail a page buffer according to example embodiments.

Referring to FIG. 10, the page buffer PB may correspond to an example of the page buffer PB in FIG. 1. The page buffer PB may include a page buffer unit PBU and a cache unit CU. Because the cache unit CU includes a cache latch (C-LATCH) CL, and the C-LATCH CL is connected to a data input/output line, the cache unit CU may be adjacent to the data input/output line. Accordingly, the page buffer unit PBU and the cache unit CU may be apart from each other, and the page buffer PB may have a structure in which the page buffer unit PBU and the cache unit CU are apart from each other.

The page buffer unit PBU may include a main unit MU. The main unit MU may include main transistors in the page buffer PB. The page buffer unit PBU may further include a bit-line selection transistor TR_hv that is connected to the bit-line BL and driven by a bit-line selection signal BLSLT. The bit-line select transistor TR_hv may include a high voltage transistor, and accordingly, the bit-line selection transistor TR_hv may be in a different well region from the main unit MU, that is, in a high voltage unit HVU.

The main unit MU may include a sensing latch (S-LATCH) SL, a force latch (F-LATCH) FL, an upper bit latch (M-LATCH) ML and a lower bit latch (L-LATCH) LL. According to an embodiment, the S-LATCH SL, the F-LATCH FL, the M-LATCH ML, or the L-LATCH LL may be referred to as main latches. The main unit MU may further include a precharge circuit PC capable of controlling a precharge operation on the bit-line BL or a sensing node SO based on a bit-line clamping control signal BLCLAMP, and may further include a transistor PM' driven by a bit-line setup signal BLSETUP.

The S-LATCH SL may, during a read or program verification operation, store data stored in a memory cell MC or a sensing result of a threshold voltage of the memory cell MC. In addition, the S-LATCH SL may, during a program operation, be used to apply a program bit-line voltage or a program inhibit voltage to the bit-line BL. The F-LATCH FL may be used to improve threshold voltage distribution during the program operation. The F-LATCH FL may store force data. After the force data is initially set to '1', the force data may be converted to '0' when the threshold voltage of the memory cell MC enters a forcing region that has a lower voltage than a target region. By utilizing the force data during a program execution operation, the bit-line voltage may be controlled, and the program threshold voltage distribution may be formed narrower.

The M-LATCH ML, the L-LATCH LL, and the C-LATCH CL may be utilized to store data externally input during the program operation, and may be referred to as data latches. When data of 3 bits is programmed in one memory cell MC, the data of 3 bits may be stored in the M-LATCH ML, the L-LATCH LL, and the C-LATCH CL, respectively. Until a program of the memory cell MC is completed, the M-LATCH ML, the L-LATCH LL, and the C-LATCH CL may maintain the stored data. In addition, the C-LATCH CL may receive data read from a memory cell MC during the read operation from the S-LATCH SL, and output the received data to the outside via the data input/output line.

In addition, the main unit MU may further include first through fourth transistors NM1 through NM4. The first transistor NM1 may be connected between the sensing node SO and the S-LATCH SL, and may be driven by a ground control signal SOGND. The second transistor NM2 may be connected between the sensing node SO and the F-LATCH FL, and may be driven by a forcing monitoring signal MON_F. The third transistor NM3 may be connected between the sensing node SO and the M-LATCH ML, and may be driven by a higher bit monitoring signal MON_M. The fourth transistor NM4 may be connected between the sensing node SO and the L-LATCH LL, and may be driven by a lower bit monitoring signal MON_L.

In addition, the main unit MU may further include fifth and sixth transistors NM5 and NM6 connected to each other in series between the bit-line selection transistor TV_hv and the sensing node SO. The fifth transistor NM5 may be driven by a bit-line shut-off signal BLSHF, and the sixth transistor NM6 may be driven by a bit-line connection control signal CLBLK. In addition, the main unit MU may further include a precharge transistor PM. The precharge transistor PM may be connected to the sensing node SO, driven by a load signal LOAD, and precharge the sensing node SO to a precharge level in a precharge period.

In an embodiment, the main unit MU may further include a pair of pass transistors connected to the sensing node SO, or first and second pass transistors TR and TR'. According to an embodiment, the first and second pass transistors TR and TR' may also be referred to as first and second sensing node connection transistors, respectively. The first and second pass transistors TR and TR' may be driven in response to a pass control signal SO_PASS. According to an embodiment, the pass control signal SO_PASS may be referred to as a sensing node connection control signal. The first pass transistor TR may be connected between a first terminal SOC_U and the sensing node SO, and the second pass transistor TR' may be between the sensing node SO and a second terminal SOC_D.

For example, when the page buffer unit PBU corresponds to the second page buffer unit PBU2 in FIG. 9, the first terminal SOC_U may be connected to one end of the pass transistor included in the first page buffer unit PBU1, and the second terminal SOC_D may be connected to one end of the pass transistor included in the third page buffer unit PBU3. In this manner, the sensing node SO may be electrically connected to the combined sensing node SOC via pass transistors included in each of the third through m-th page buffer units PBU3 through PBUM.

During the program operation, the page buffer PB may verify whether the program is completed in a memory cell MC selected among the memory cells MC included in the NAND string connected to the bit-line BL. The page buffer PB may store data sensed via the bit-line BL during the program verify operation in the S-LATCH SL. The M-LATCH ML and the L-LATCH LL may be set in which target data is stored according to the sensed data stored in the S-LATCH SL.

For example, when the sensed data indicates that the program is completed, the M-LATCH ML and the L-LATCH LL may be switched to a program inhibit setup for the selected memory cell MC in a subsequent program loop. The C-LATCH CL may temporarily store input data provided from the outside. During the program operation, the target data to be stored in the C-LATCH CL may be stored in the M-LATCH ML and the L-LATCH LL.

Hereinafter, assuming that signals for controlling elements in the page buffer circuit 210 are included in the page buffer control signal PCTL in FIG. 1.

Figure 11:
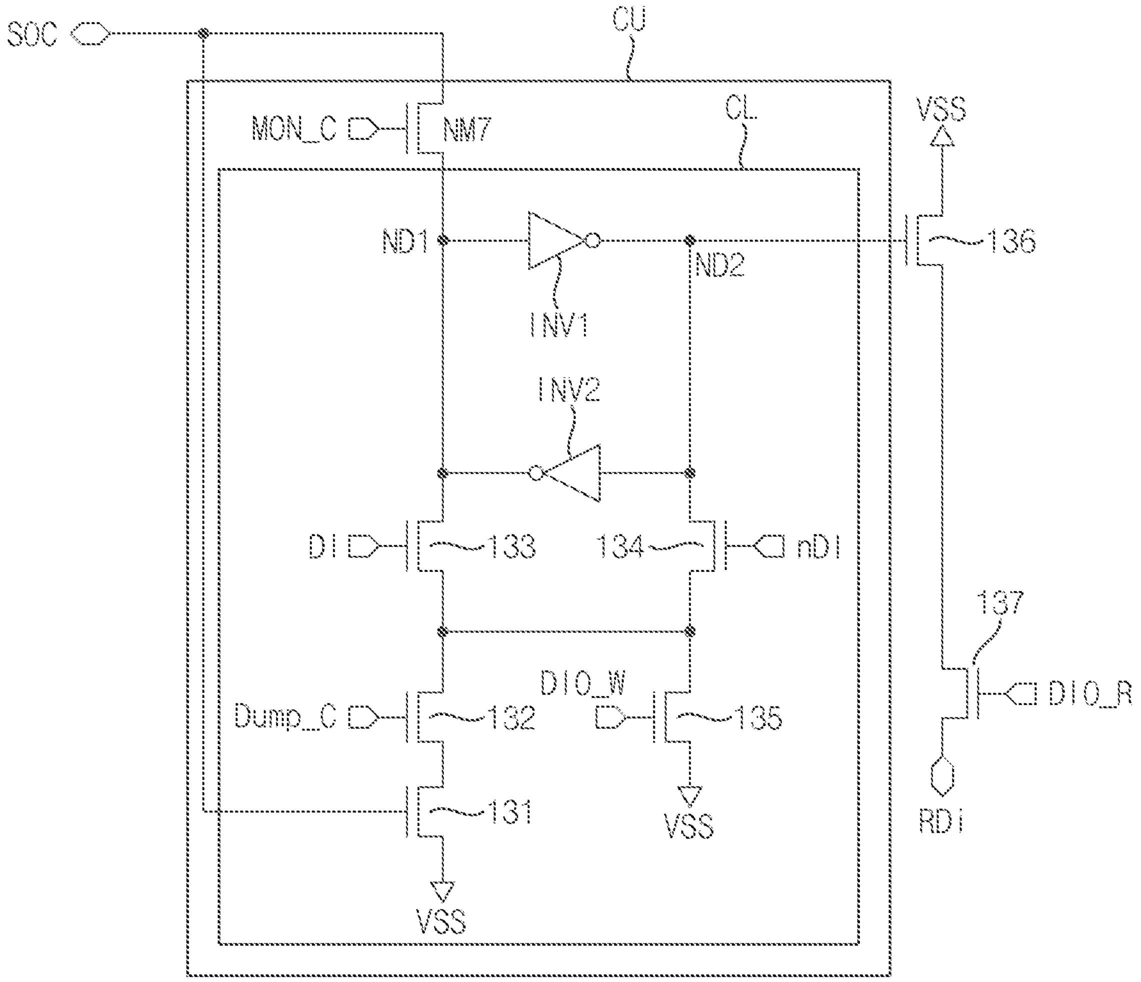
FIG. 11 is a circuit diagram illustrating an example of the cache unit according to example embodiments.

FIG. 11 is a circuit diagram illustrating an example of the cache unit according to example embodiments.

Referring to FIGS. 10 and 11, the cache unit CU may include the monitor transistor NM7 and the C-LATCH CL, and the C-LATCH CL may include first and second inverters INV1 and INV2, a dump transistor 132, and transistors 131, 133, 134 and 135. The monitor transistor NM7 may be driven based on the cache monitoring signal MON_C, and may control a connection between the coupling sensing node SOC and the C-LATCH CL.

The first inverter INV1 may be connected between the first node ND1 and the second node ND2, the second inverter INV2 may be connected between the second node ND2 and the first node ND1, and thus, the first and second inverters INV1 and INV2 may form a latch. The transistor 131 may include a gate connected to the combined sensing node SOC and may be connected between the dump transistor 132 and a ground voltage VSS.

The dump transistor 132 may be driven by a dump signal Dump_C, and may transmit data stored in the C-LATCH CL to a main latch, for example, the S-LATCH SL in the page buffer unit PBU. The transistor 133 may be driven by a data signal DI, a transistor 134 may be driven by a data inversion signal nDI, and the transistor 135 may be driven by a write control signal DIO_W. When the write control signal DIO_W is activated, voltage levels of the first and second nodes ND1 and ND2 may be determined based on the data signal DI and the data inversion signal nDI, respectively.

The cache unit CU may be connected to an data I/O line (or data I/O terminal) RDi via transistors 136 and 137. The transistor 136 may include a gate connected to the second node ND2, and may be turned on or off based on a voltage level of the second node ND2. The transistor 137 may be driven by a read control signal DIO_R. When the read control signal DIO_R is activated and the transistor 137 is turned on, a voltage level of the input/output terminal RDi may be determined as 'l' or '0' based on a state of the C-LATCH CL.

Figure 12:
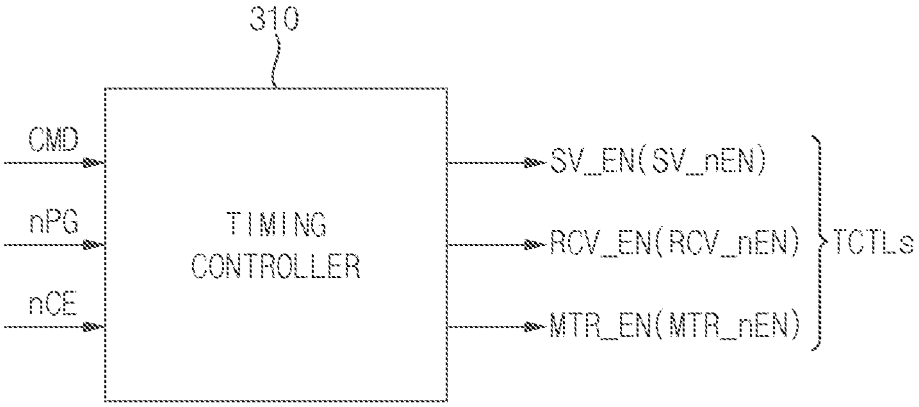
FIG. 12 illustrates an example of the timing controller in the nonvolatile memory device of FIG. 1 according to example embodiments.

FIG. 12 illustrates an example of the timing controller in the nonvolatile memory device of FIG. 1 according to example embodiments.

Referring to FIG. 12, the timing controller 310 may generate the timing control signals TCTLs based on the chip enable signal nCE, the command CMD and the first power gating signal nPG.

The timing control signals TCTLs may include a first enable signal SV_EN, a first inverted enable signal SV_nEN, a second enable signal RCV_EN, a second inverted enable signal RCV_nEN, a third enable signal MTR_EN and a third inverted enable signal MTR nEN. The timing controller 310 may control an operation of a recovery latch (460 in FIGS. 14A through 14C) by providing the first enable signal SV_EN, the first inverted enable signal SV_nEN, the second enable signal RCV_EN, the second inverted enable signal RCV_nEN, the third enable signal MTR_EN and the third inverted enable signal MTR_nEN to the recovery latch 460.

Figure 13:
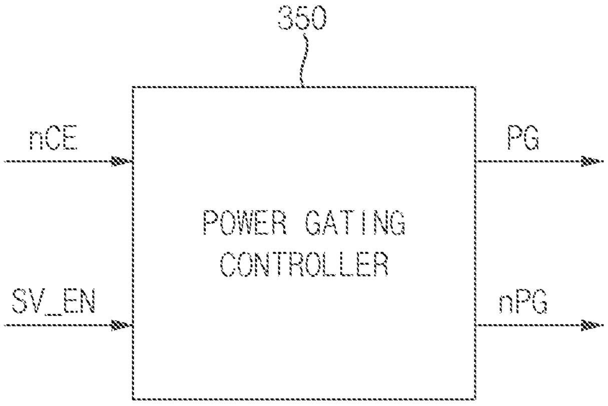
FIG. 13 illustrates an example of the power gating controller in the nonvolatile memory device of FIG. 1 according to example embodiments.

FIG. 13 illustrates an example of the power gating controller in the nonvolatile memory device of FIG. 1 according to example embodiments.

Referring to FIG. 13, the power gating controller 350 may generate the first power gating signal nPG and the second power gating signal PG based on the chip enable signal nCE and the first enable signal SV_EN. The power gating controller 350 may control a power gating on a flip-flop (420 in FIGS. 14A through 14C) by providing the first power gating signal nPG and the second power gating signal PG to a first cut-off transistor (411 in FIG. 14A) and a second cut-off transistor (413 in FIG. 14A), respectively.

Figure 14A:
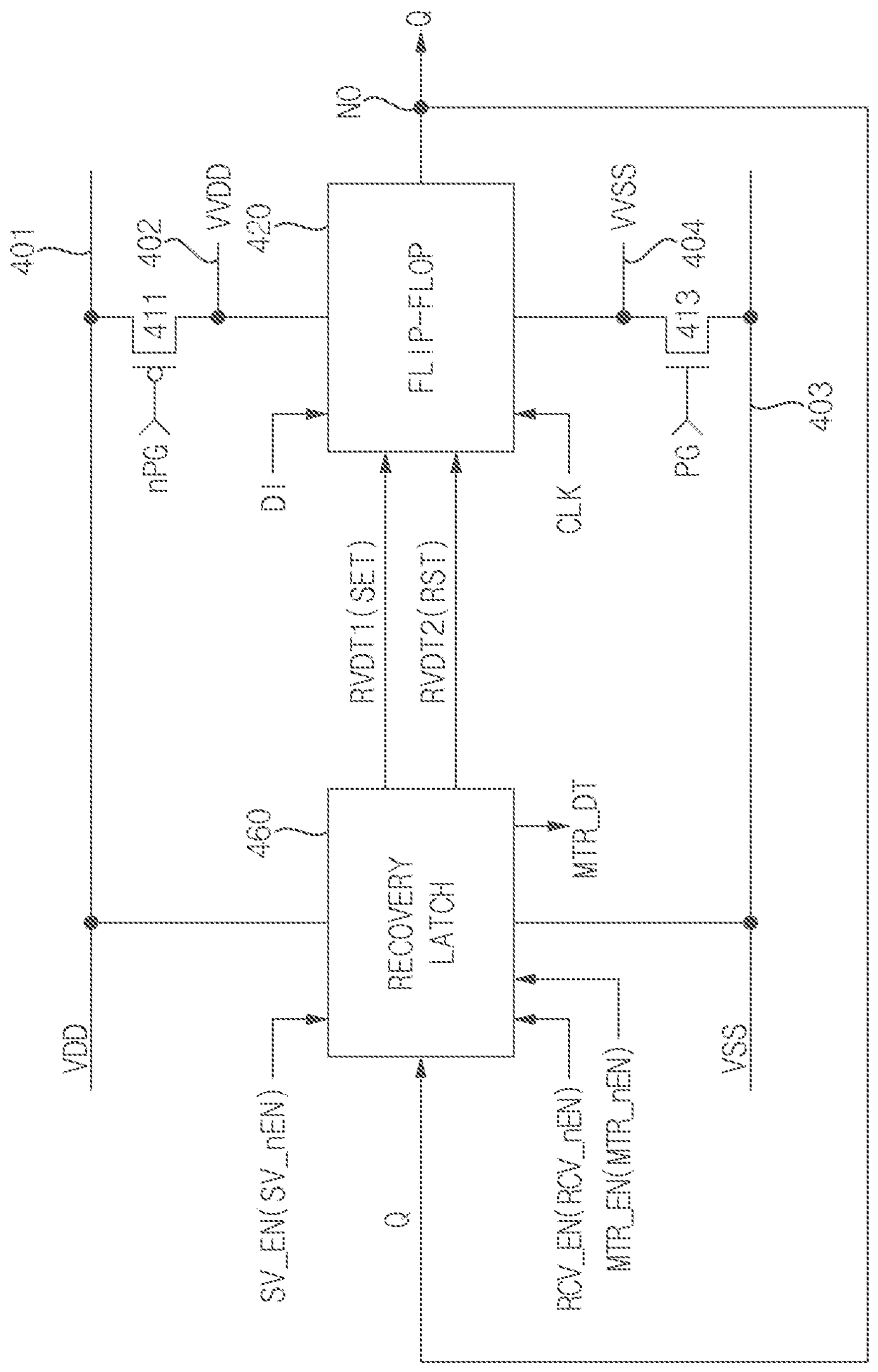
FIG. 14A is a block diagram illustrating one of the first data flip-flop circuits according to example embodiments.

FIG. 14A is a block diagram illustrating one of the first data flip-flop circuits according to example embodiments.

Each of the second data first data flip-flop circuits 400*b* may have a same configuration as the first data flip-flop circuit 400*a* in FIG. 14A.

Hereinafter, the first data flip-flop circuit 400*a* will be referred to as a data flip-clop circuit for convenience of explanation.

Referring to FIG. 14A, the data flip-flop circuit 400*a* may include a flip-flop 420, a recovery latch 460, a first cut-off transistor 411 and a second cut-off transistor 413.

The recovery latch 460 may be connected between a first power line 401 to which a power supply voltage VDD is applied and a third power line 403 to which a ground voltage VSS is applied, and may operate based on the power supply voltage VDD and the ground voltage VSS.

The flip-flop 420 may be connected between a second power line 402 to which a virtual power supply voltage VVDD is applied and a fourth power line 404 to which a virtual ground voltage VVSS is applied, and may operate based on the virtual power supply voltage VVDD and the virtual ground voltage VVSS. The virtual power supply voltage VVDD may be based on the power supply voltage VDD and the virtual ground voltage VVSS may be based on the ground voltage VSS.

The first cut-off transistor 411 may be connected between the first power line 401 and the second power line 402 and may have a gate receiving the first power gating signal nPG. Thus, the first cut-off transistor 411 may selectively connect the first power line 401 to the second power line 402 based on the first power gating signal nPG. When the first cut-off transistor 411 is turned-on based on the first power gating signal nPG, the flip-flop 420 may receive the virtual power supply voltage VVDD based on the power supply voltage VDD. When the first cut-off transistor 411 is turned-off based on the first power gating signal nPG, the virtual power supply voltage VVDD provided to the flip-flop 420 may be cut off.

The second cut-off transistor 413 may be connected between the third power line 403 and the fourth power line 404 and may have a gate receiving the second power gating signal PG. Thus, the second cut-off transistor 413 may selectively connect the third power line 403 to the fourth power line 404 based on the second power gating signal PG. When the second cut-off transistor 413 is turned-on based on the second power gating signal PG, the flip-flop 420 may receive the virtual ground voltage VVSS based on the ground voltage VSS. When the second cut-off transistor 413 is turned-off based on the second power gating signal PG, the virtual ground voltage VVSS provided to the flip-flop 420 may be cut off.

The flip-flop 420 may receive a data signal DI and a clock signal CLK. The flip-flop 420 may store the data signal DI that is input, using the clock signal CLK and the virtual power supply voltage VVDD and may provide the stored data signal DI as an output signal Q at an output node NO in response to a rising transition of the clock signal CLK.

The recovery latch 460 may be connected to the power supply voltage VDD and the ground voltage VSS and may be connected to the flip-flop 420 at the output node NO. The recovery latch 460 may receive the first enable signal SV_EN, the first inverted enable signal SV_nEN, the second enable signal RCV_EN, the second inverted enable signal RCV_nEN, the third enable signal MTR_EN and the third inverted enable signal MTR_nEN from the timing controller 310 of FIG. 12 and may receive the output signal Q from the flip-flop 420. The recovery latch 460 may store the output signal Q internally in response to a first transition to a deactivation of the chip enable signal nCE (refer to FIG. 18) and based on the first enable signal SV_EN, the first inverted enable signal SV_nEN, the second enable signal RCV_EN, the second inverted enable signal RCV_nEN, the third enable signal MTR_EN, may recover the stored output signal in response to an end of a power gating interval (INT13 in FIG. 18) based on a second transition to an activation of the chip enable signal nCE (refer to FIG. 18) and may provide recovered output signal RVDT1 and RVDT2 to the flip-flop 420. The recovered output signal RVDT1 and RVDT2 may include a first recovered output signal RVDT1 and a second recovered output signal RVDT2.

The recovery latch 460 may provide the flip-flop 420 with the first recovered output signal RVDT1 and the second recovered output signal RVDT2 as a set data SET and a reset data RST, respectively.

Figure 14B:
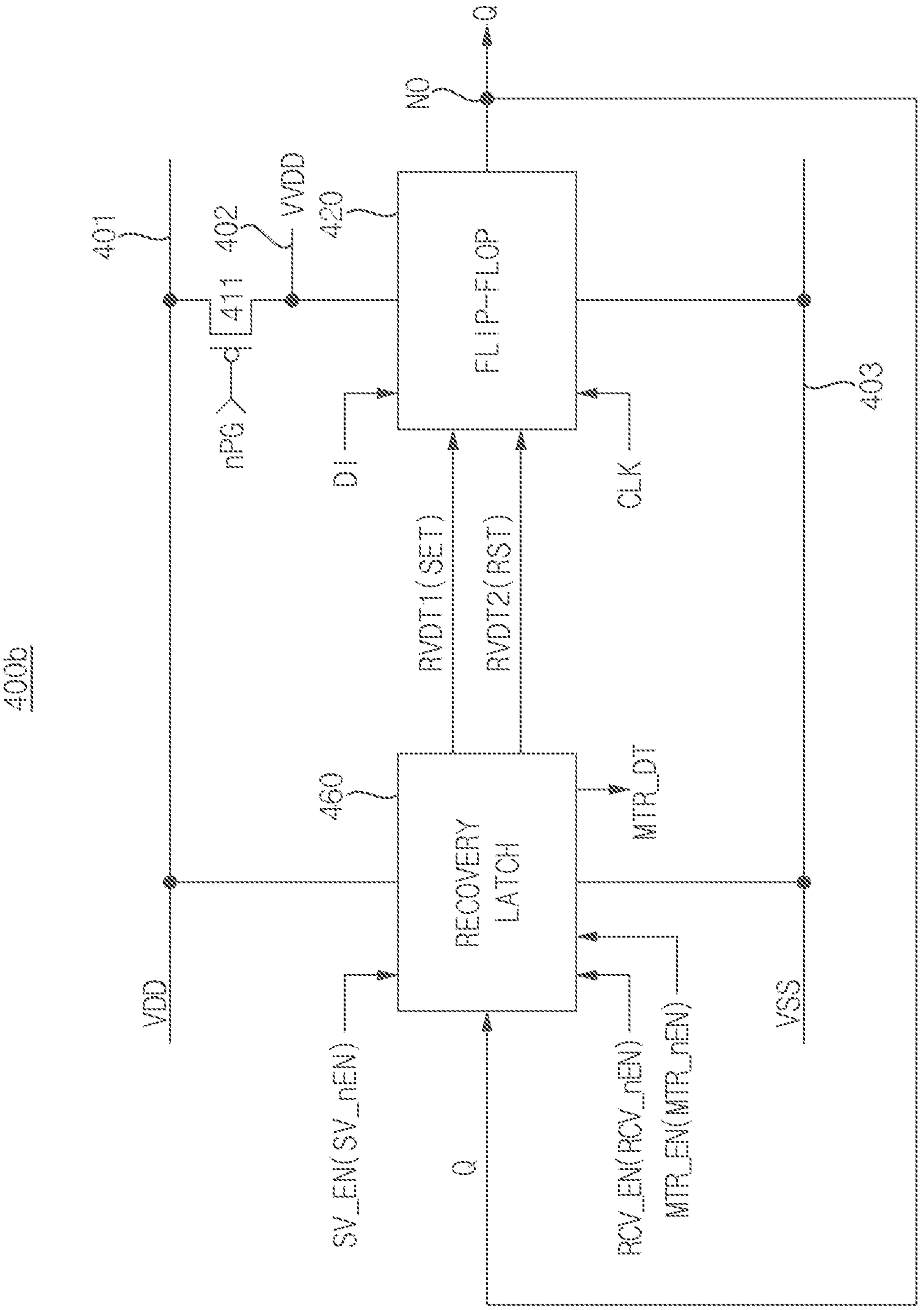
FIG. 14B is a block diagram illustrating one of the first data flip-flop circuits according to example embodiments.

FIG. 14B is a block diagram illustrating one of the first data flip-flop circuits according to example embodiments.

Each of the second data first data flip-flop circuits 400*b* may have a same configuration as a first data flip-flop circuit 400*aa* in FIG. 14B.

Referring to FIG. 14B, the first data flip-flop circuit 400*aa* may include a flip-flop 420, a recovery latch 460 and a first cut-off transistor 411.

The first data flip-flop circuit 400*aa* differs from the data flip-flop circuit 400*a* of FIG. 14A in that the third power line 403 is directly connected to the flip-flop 420. Descriptions repeated with FIG. 14A will be omitted.

Figure 14C:
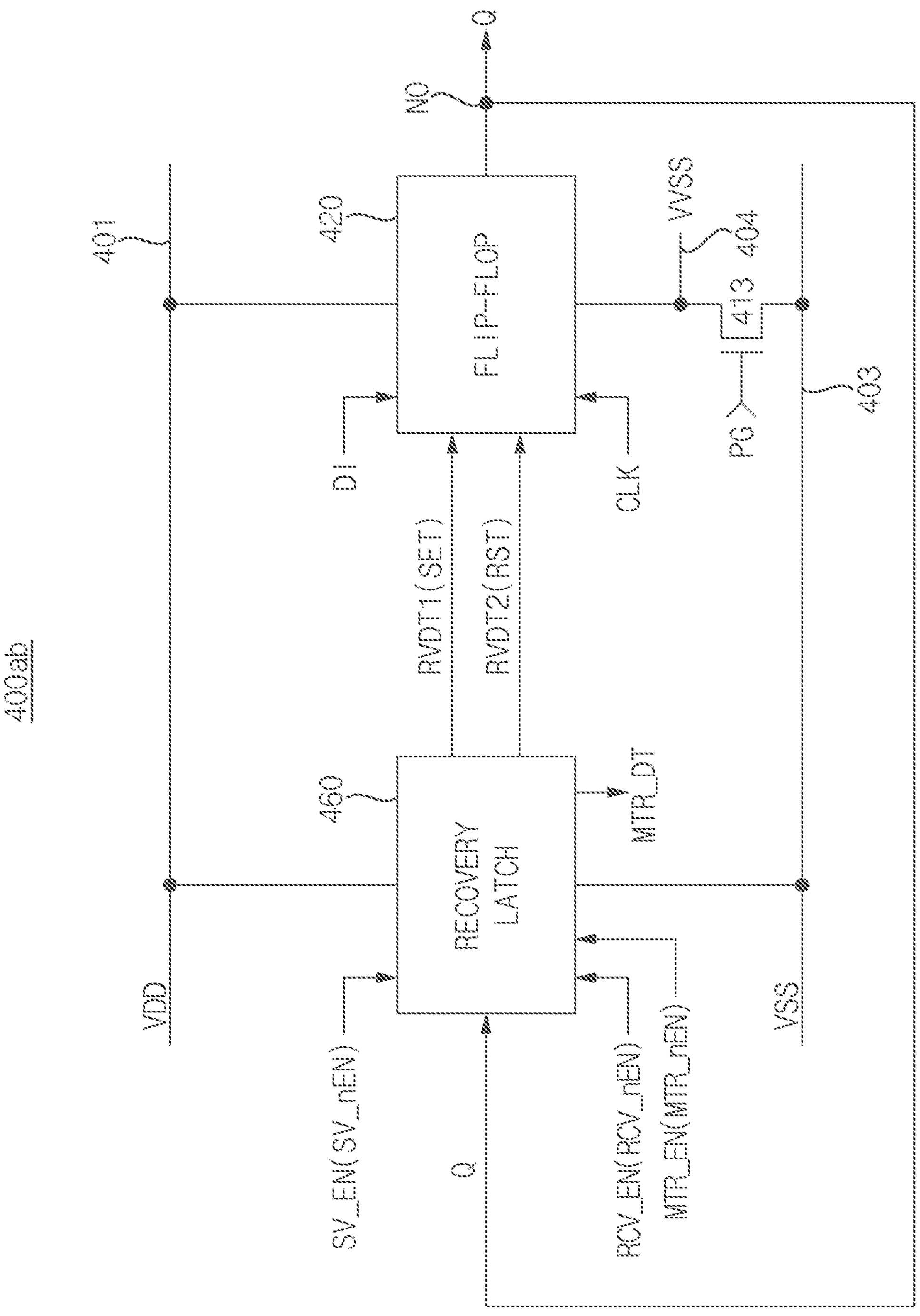
FIG. 14C is a block diagram illustrating one of the first data flip-flop circuits according to example embodiments.

FIG. 14C is a block diagram illustrating one of the first data flip-flop circuits according to example embodiments.

Each of the second data first data flip-flop circuits 400*b* may have a same configuration as a first data flip-flop circuit 400*ab* in FIG. 14C.

Referring to FIG. 14B, the first data flip-flop circuit 400*aa* may include a flip-flop 420, a recovery latch 460 and a second cut-off transistor 413.

The first data flip-flop circuit 400*ab* differs from the data flip-flop circuit 400*a* of FIG. 14A in that the first power line 401 is directly connected to the flip-flop 420. Descriptions repeated with FIG. 14A will be omitted.

Figure 15:
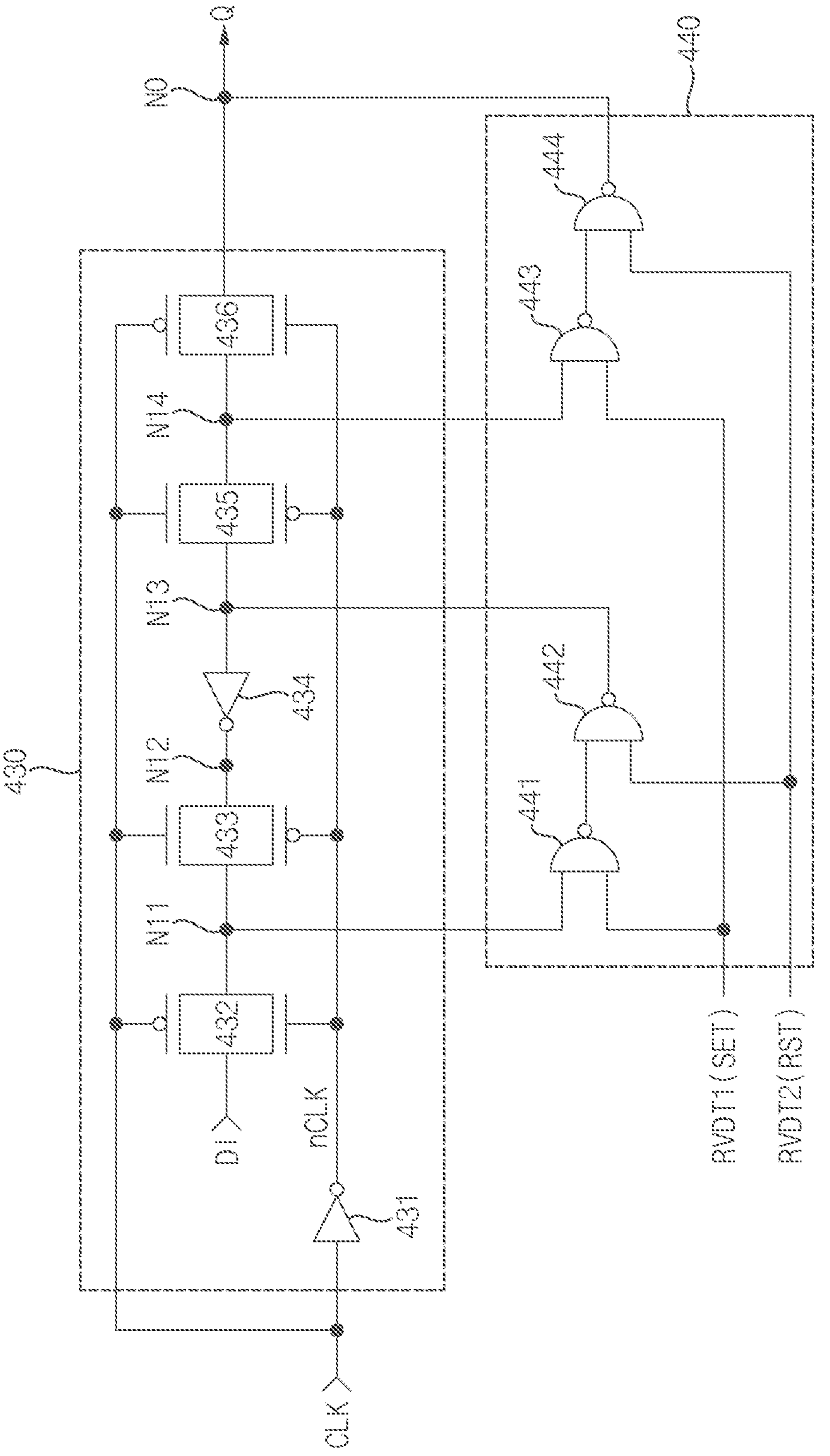
FIG. 15 is a circuit diagram illustrating an example of the flip-flop in the data flip-flop circuit of FIG. 14A according to example embodiments.

FIG. 15 is a circuit diagram illustrating an example of the flip-flop in the data flip-flop circuit of FIG. 14A according to example embodiments.

Referring to FIG. 15, the flip-flop 420 may include a first circuit 430 and a second circuit 440.

The first circuit 430 may to store the data signal DI and may provide the output signal Q to the output node NO in response to the rising transition of the clock signal CLK. The second circuit 440 may provide the first recovered output signal RVDT1 to the output node NO.

The first circuit 430 may include a first inverter 431, a first transmission gate 432, a second transmission gate 433, a third transmission gate 435, a fourth transmission gate 436 and a second inverter 434.

The first inverter 431 may output an inverted clock signal nCLK by inverting the clock signal CLK. The first transmission gate 432 may transfer the data signal DI to a first node N11 based on the clock signal CLK and the inverted clock signal nCLK. The second transmission gate 433 may be connected to the first node N11 and may transfer an output of the first transmission gate 432 to a second node N12 based on the clock signal CLK and the inverted clock signal nCLK.

The second inverter 434 may have an output connected to the second node N12 and an input connected to a third node N13. The third transmission gate 435 may be connected to the input of the second inverter 434 at the third node N13, and may transfer the input of the second inverter 434 to a fourth node N14 based on the clock signal CLK and the inverted clock signal nCLK. The fourth transmission gate 436 may be connected to the fourth node N14, and may transfer an output of the third transmission gate 435 to the output node NO as the output signal Q based on the clock signal CLK and the inverted clock signal nCLK.

The second circuit 440 may include a first NAND gate 441, a second NAND gate 442, a third NAND gate 443 and a fourth NAND gate 444.

The first NAND gate 441 may be connected to the first node N11, and may perform a NAND operation on the output of the first transmission gate 432 and the first recovered output signal RVDT1. The second NAND gate 442 may perform a NAND operation on the output of the first NAND gate 441 the second recovered output signal RVDT2 and may have an output connected to the third node N13. The third NAND gate 443 may be connected to the fourth node N14, and may perform a NAND operation on the output of the third transmission gate 435 and the first recovered output signal RVDT1. The fourth NAND gate 444 may perform a NAND operation on the output of the third NAND gate 443 and the second recovered output signal RVDT2, and may have an output connected to the output node NO.

Therefore, when the flip-flop 420 operates normally (i.e., performs a normal operation), that is, when the chip enable signal nCE has a logic low level, each of the first recovered output signal RVDT1 and the second recovered output signal RVDT2 has a logic high level. Accordingly, the first recovered output signal RVDT1 and the second recovered output signal RVDT2 may be non-associated with a normal operation of the flip-flop 420 and the first NAND gate 441 and the second NAND gate 442 operate as an inverter, respectively. Therefore, the first NAND gate 441, the second NAND gate 442 and the second inverter 434 operate as a latch and store the data signal DI in response to the clock signal CLK having a logic low level and the flip-flop 420 may provide the stored data signal DI as the output signal Q in response to a rising transition of the clock signal CLK.

When the chip enable signal nCE is deactivated with a logic high level and the flip-flop 420 does not operate normally because the virtual power supply voltage VVDD and the virtual ground voltage VVSS which are provided to the flip-flop 420 are floating, the second NAND gate 442 may set the third node N13 and the fourth node N14 to a logic high level and the fourth NAND gate 444 may set the output signal Q of the output node NO to a logic high level, in response to the first recovered output signal RVDT1 having a logic high level. In addition, the second NAND gate 442 may reset the third node N13 and the fourth node N14 to a logic low level and the fourth NAND gate 444 may reset the output signal Q of the output node NO to a logic low level, in response to the first recovered output signal RVDT1 having a logic low level.

Figure 16:
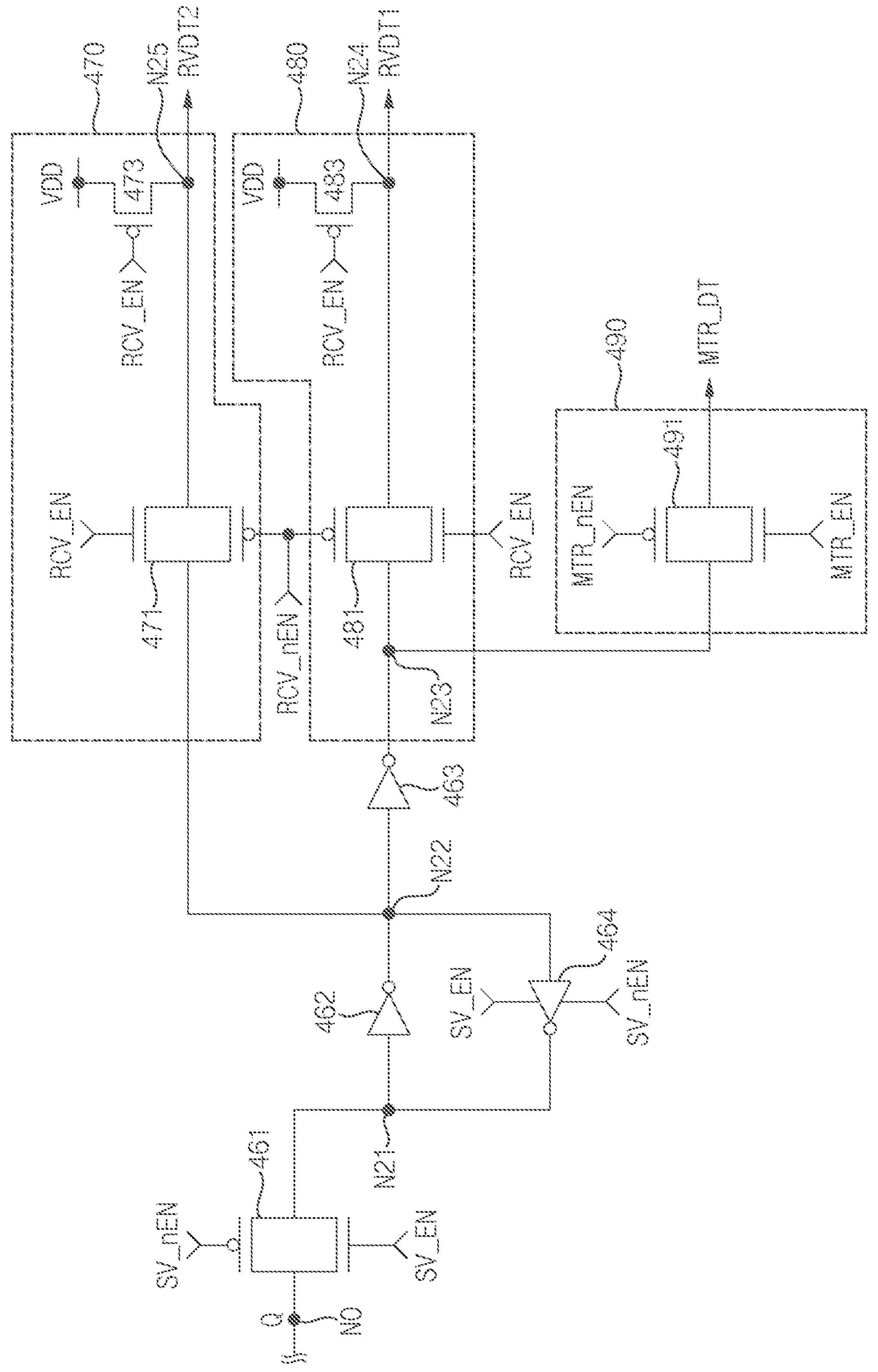
FIG. 16 is a circuit diagram illustrating an example of the recovery latch in the data flip-flop circuit of FIG. 14A according to example embodiments.

FIG. 16 is a circuit diagram illustrating an example of the recovery latch in the data flip-flop circuit of FIG. 14A according to example embodiments.

Referring to FIG. 16, the recovery latch 460 may include a first transmission gate 461, a first inverter 462, a second inverter 463, a tristate inverter 464, a first branch circuit 480, a second branch circuit 470 and a third branch circuit 490.

Figure 18:
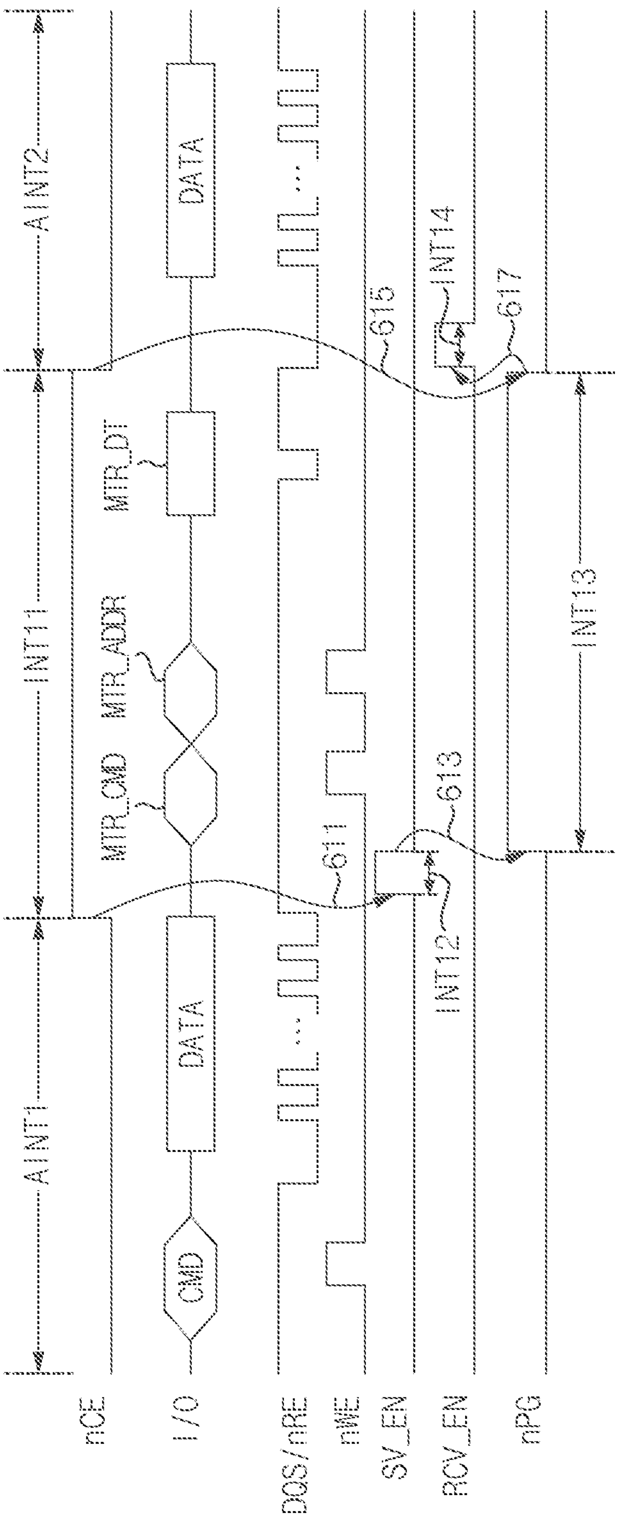
FIG. 18 is a timing diagram for describing an operation of the data flip-flop circuit of FIG. 14A according to example embodiments.

The first transmission gate 461 may be connected between the output node NO and a first node N21, and may connect the output node NO to the first node N21 in response to an activation of the first enable signal SV_EN and the first inverted enable signal SV_nEN based on the first transition to a logic high level of the chip enable signal nCE (refer to FIG. 18). The first inverter 462 may be connected between the first node N21 and a second node N22. The tristate inverter 464 may be connected between the second node N22 and the first node N21, and the tristate inverter 464 and the first inverter 462 may operate as a latch. The second inverter 463 may be connected between the second node N22 and a third node N23.

The first branch circuit 480 may be connected between the third node N23 and a fourth node N24, and may output a logic level of the third node N23 as the first recovered output signal RVDT1, in response to an activation of the second enable signal RCV_EN and the second inverted enable signal RCV_nEN which are based on the second transition of the chip enable signal nCE (refer to FIG. 18). The logic level of the third node N23 may correspond to the output signal stored in the recovery latch 460.

The first branch circuit 480 may include a second transmission gate 481 and a first precharge transistor 483. The second transmission gate 481 may be connected between the third node N23 and the fourth node N24, and may transfer an output of the second inverter 463 to the fourth node N24 in response to the activation of the second enable signal RCV_EN and the second inverted enable signal RCV_nEN. The first precharge transistor 483 may be connected between the power supply voltage VDD and the fourth node N24, may have a gate to receiving the second enable signal RCV_EN and may precharge the fourth node N24 with a logic high level in response to a deactivation of the second enable signal RCV_EN. During the chip enable signal nCE being activated with a logic low level, the first recovered output signal RVDT1 may have a logic high level.

The second branch circuit 470 may be connected between the second node N22 and a fifth node N25, and may output a logic level of the second node N22 as the second recovered output signal RVDT2, in response to the activation of the second enable signal RCV_EN and the second inverted enable signal RCV_nEN.

The second branch circuit 470 may include a third transmission gate 471 and a second precharge transistor 473. The third transmission gate 471 may be connected between the second node N22 and the fifth node N25, and may transfer an output of the first inverter 462 to the fifth node N25 in response to the activation of the second enable signal RCV_EN and the second inverted enable signal RCV_nEN. The second precharge transistor 473 may be connected between the power supply voltage VDD and the fifth node N25, may have a gate to receiving the second enable signal RCV_EN and may precharge the fifth node N25 with a logic high level in response to a deactivation of the second enable signal RV_EN. During the chip enable signal nCE being activated with a logic low level, the second recovered output signal RVDT2 may have a logic high level.

The third branch circuit 490 may be connected to the third node N23 in parallel with the first branch circuit 480, and may output the logic level of the third node N23 as a monitoring data MTR_DT in response to the third enable signal MTR_EN and the third inverted enable signal MTR_nEN based on an external command (MTR_CMD in FIG. 18) during a first time interval (INT11 in FIG. 18) in which the chip enable signal nCE is deactivated.

The third branch circuit 490 may include a transmission gate 491. The transmission gate 491 may be connected to the third node N23 and may output the logic level of the third node N23 as the monitoring data MTR_DT in response to an activation of the third enable signal MTR_EN and the third inverted enable signal MTR_nEN. The memory controller 20 in FIG. 1 may check a state of the recovery latch 460 based on a logic level of the monitoring data MTR_DT.

The tristate inverter 464 may operate as an inverter which inverts a logic level of the second node to provide the inverted logic level to the first node N21, based on a deactivation of the first enable signal SV_EN and the first inverted enable signal SV_nEN, and may not operate as an inverter based on an activation of the first enable signal SV_EN and the first inverted enable signal SV_nEN.

Figure 17:
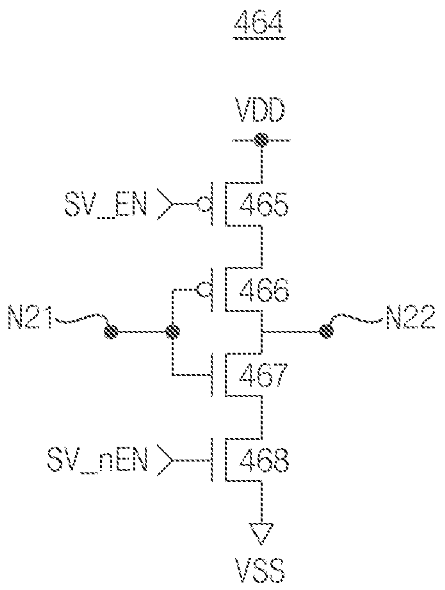
FIG. 17 illustrates an example configuration of the tristate inverter in FIG. 16 according to example embodiments.

FIG. 17 illustrates an example configuration of the tristate inverter in FIG. 16 according to example embodiments.

Referring to FIG. 17, the tristate inverter 464 may include p-channel metal-oxide semiconductor (PMOS) transistors 465 and 466 and n-channel metal-oxide semiconductor (NMOS) transistors 467 and 468 which are connected in series between the power supply voltage VDD and the ground voltage VSS.

The PMOS transistor 465 may be connected between the power supply voltage VDD and the PMOS transistor 466 and may have a gate to receive the first enable signal SV_EN. The PMOS transistor 466 may be connected between the PMOS transistor 465 and the NMOS transistor 467 and may have a gate coupled to the first node N21.

The NMOS transistor 467 may be connected between the PMOS transistor 466 and the NMOS transistor 468 and may have a gate coupled to the first node N21. The NMOS transistor 468 may be connected between the NMOS transistor 467 and the ground voltage VSS and may have a gate to receive the first inverted enable signal SV_nEN.

Drains of the PMOS transistor 466 and the NMOS transistor 467 may be coupled to the second node N22.

When the first enable signal SV_EN and the first inverted enable signal SV_nEN are deactivated, the PMOS transistor 465 and the NMOS transistor 468 are turned-on and the tristate inverter 464 operates as an inverter. When the first enable signal SV_EN and the first inverted enable signal SV_nEN are activated, the PMOS transistor 465 and the NMOS transistor 468 are turned-off and the tristate inverter 464 operates as a high-impedance element.

FIG. 18 is a timing diagram for describing an operation of the data flip-flop circuit of FIG. 14A according to example embodiments.

Referring to FIGS. 12 through 14A, 15, 16 and 18, during a first activation time interval AINT1 in which the chip enable signal nCE is activated with a logic low level, the control circuit 220 in FIG. 1 may write the data DATA in the memory cell array 100 by receiving the command CMD and the data DATA through I/O lines, receiving the data strobe signal DQS, receiving the read enable signal nRE that is deactivated, and receiving the write enable signal nWE that is activated, from the memory controller 20.

During the first activation time interval AINT1, the first enable signal SV_EN and the second enable signal RCV_EN, which the timing controller 310 generates, are deactivated with a logic low level and the first power gating signal nPG, which the power gating controller 350 generates, is activated with a logic low level. Therefore, during the first activation time interval AINT1, the flip-flop 420 performs a normal operation and the recovery latch 460 is separated from the flip-flop 420 at the output node NO by the first transmission gate 461 and may be non-associated with the normal operation of the flip-flop 420 by providing the second circuit 440 of the flip-flop 420 with the first recovered output signal RVDT1 and the second recovered output signal RVDT2 having a logic high level.

During a first time interval INT11 in which the chip enable signal nCE is deactivated with a logic high level after the first activation time interval AINT1, the timing controller 310 transitions the first enable signal SV_EN to a logic high level during a second time interval INT12 in response to a first transition to a deactivation of the chip enable signal nCE as a reference numeral 611 indicates and the recovery latch 460 stores the output signal Q provided from the output node NO in response to the first enable signal SV_EN being activated.

The power gating controller 350, as a reference numeral 613 indicates, floats the virtual power supply voltage VVDD provided to the flip-flop 420 by deactivating the first power gating signal nPG with a logic high level in response to the first enable signal SV_EN transitioning to a logic low level during a power gating interval INT13.

During the first time interval INT11, the timing controller 310 activates the third enable signal MTR_EN based on a monitoring command MTR_CMD and a monitoring address MTR_ADDR received from the memory controller 20 such that the recovery latch 460 provides the stored output data Q as the monitoring data MTR_DT and the memory controller 20 may check a state of the recovery latch 460 based on the monitoring data MTR DT.

The power gating controller 350, as a reference numeral 615 indicates, provides the virtual power supply voltage VVDD to the flip-flop 420 by activating the first power gating signal nPG with a logic low level in response to the second transition to an activation of the chip enable signal nCE, and the power gating controller 350, as a reference numeral 617 indicates, activates the second enable signal RCV_EN d during a time interval INT14 in response to an end of the power gating interval INT13. The recovery latch 460 provides the flip-flop 420 with the stored output signal Q as the first recovered output signal RVDT1.

During a second activation time interval AINT2 in which the chip enable signal nCE is activated with a logic low level, the control circuit 220 in FIG. 1 may read the data DATA stored the memory cell array 100 by receiving the read enable signal nRE that is activated, and may provide the memory controller 20 with the data DATA and the data strobe signal DQS through the I/O line.

Figure 19:
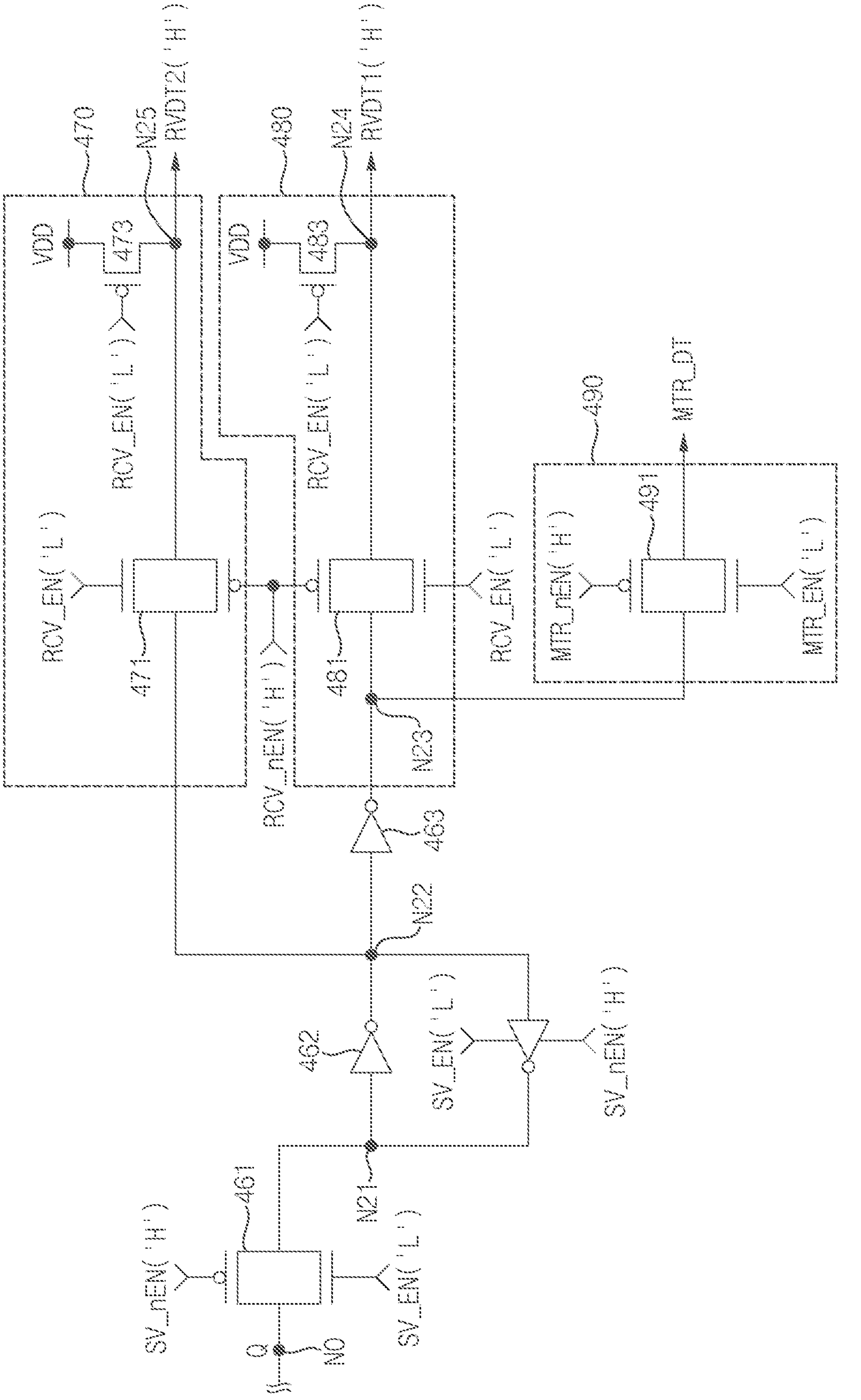
FIG. 19 illustrates an operation of the recovery latch of FIG. 16 when the chip enable signal is activated.

FIG. 19 illustrates an operation of the recovery latch of FIG. 16 when the chip enable signal is activated.

Referring to FIGS. 18 and 19, during the first activation time interval AINT1 and the second activation time interval AINT1 in which the chip enable signal nCE is activated with a logic low level, the timing controller 310 deactivates the first enable signal SV_EN with a logic low level ('L'), deactivates the first inverted enable signal SV_nEN with a logic high level ('H'), deactivates the second enable signal RCV_EN with a logic low level ('L'), deactivates the second inverted enable signal RCV_nEN with a logic high level ('H'), deactivates the third enable signal MTR_EN with a logic low level ('L') and deactivates the third inverted enable signal MTR_nEN with a logic high level ('H').

Therefore, the first transmission gate 461 separates the recovery latch 460 from the flip-flop 420 at the output node NO, the first branch circuit 480 provides the flip-flop 420 with the first recovered output signal RVDT1 having a logic high level and the second branch circuit 470 provides the flip-flop 420 with the second recovered output signal RVDT2 having a logic high level.

Figure 20:
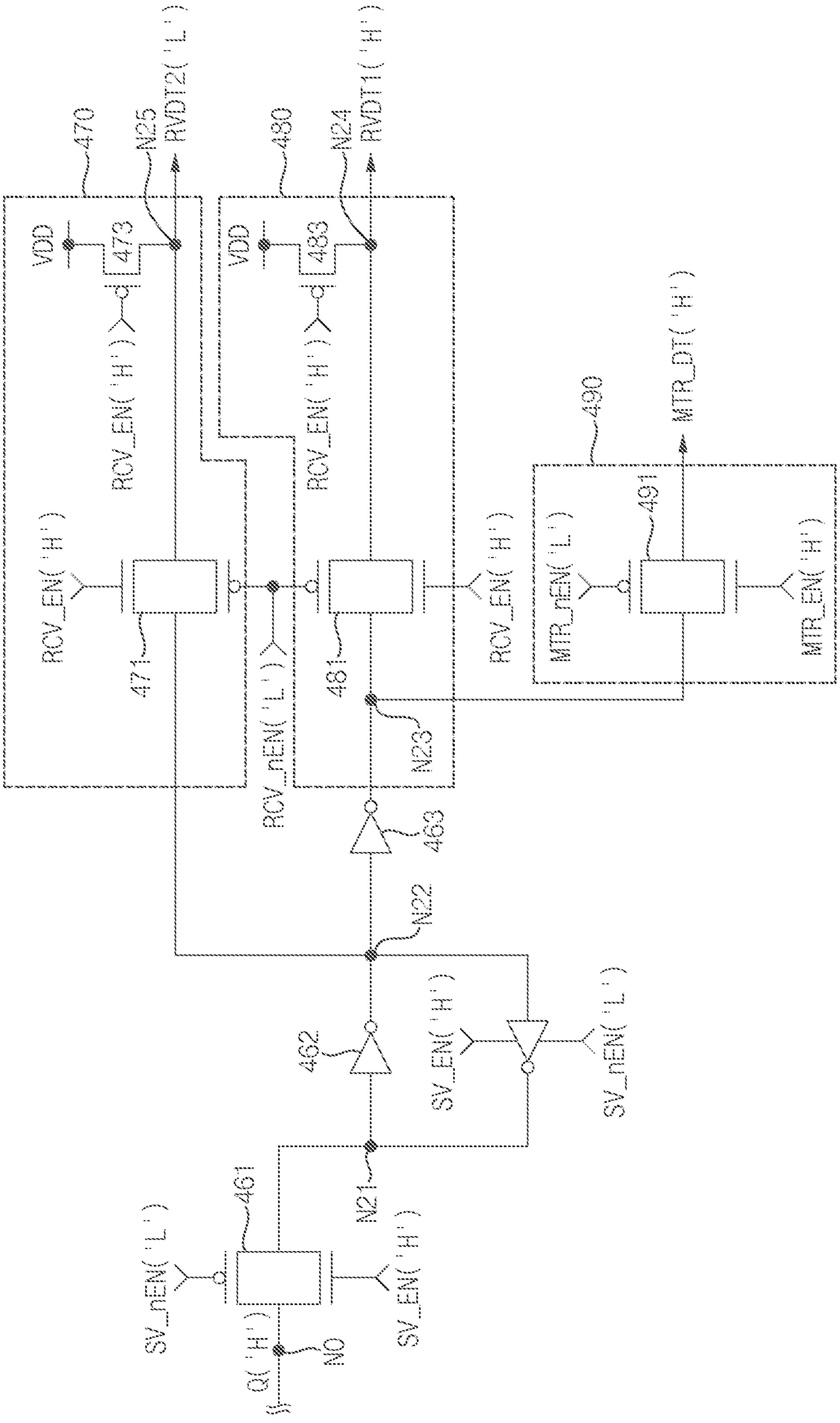
FIG. 20 illustrates an operation of the recovery latch of FIG. 16 when the chip enable signal is deactivated.

FIG. 20 illustrates an operation of the recovery latch of FIG. 16 when the chip enable signal is deactivated.

Referring to FIGS. 18 and 20, during the second time interval INT12 in which the chip enable signal nCE is deactivated with a logic high level, the timing controller 310 activates the first enable signal SV_EN with a logic high level ('H'), activates the first inverted enable signal SV_nEN with a logic low level ('L'), activates the second enable signal RCV_EN with a logic high level ('H'), activates the second inverted enable signal RCV_nEN with a logic low level ('L'), activates the third enable signal MTR_EN with a logic high level ('H') and activates the third inverted enable signal MTR_nEN with a logic low level ('L').

Therefore, the first transmission gate 461 connects the recovery latch 460 with the flip-flop 420 at the output node NO, the recovery latch 460 stores the output signal Q provided from the output node NO in response to the first enable signal SV_EN being activated and provides the flip-flop 420 with the stored output signal Q as the first recovered output signal RVDT1 in response to the second enable signal RCV_EN being activated.

The recovery latch 460 may set the flip-flop 420 by providing the first recovered output signal RVDT1 to the flip-flop 420 in response to the stored output signal Q having a logic high level. The recovery latch 460 may reset the flip-flop 420 by providing the first recovered output signal RVDT1 to the flip-flop 420 in response to the stored output signal Q having a logic low level.

Therefore, the data flip-flop circuit 400*a* according to example embodiments, includes the flip-flop 420 which stores the input data signal DI using the clock signal CLK and the virtual power supply voltage VVDD and provides the stored input data signal as the output signal Q, and the recovery latch 460 which is non-associated with a normal operation of the flip-flop 420, stores the output signal Q received from the flip-flop during a power gating interval based on the chip enable signal nCE, recovers the stored output signal Q when the power gating interval ends and sets or reset the flip-flop 420 by providing the recovered output signal to the flip-flop 420. Accordingly, the data flip-flop circuit 400*a* may ensure data retention during the power gating interval and may reduce stand-by current without degrading performance of the flip-flop 420.

Figure 21:
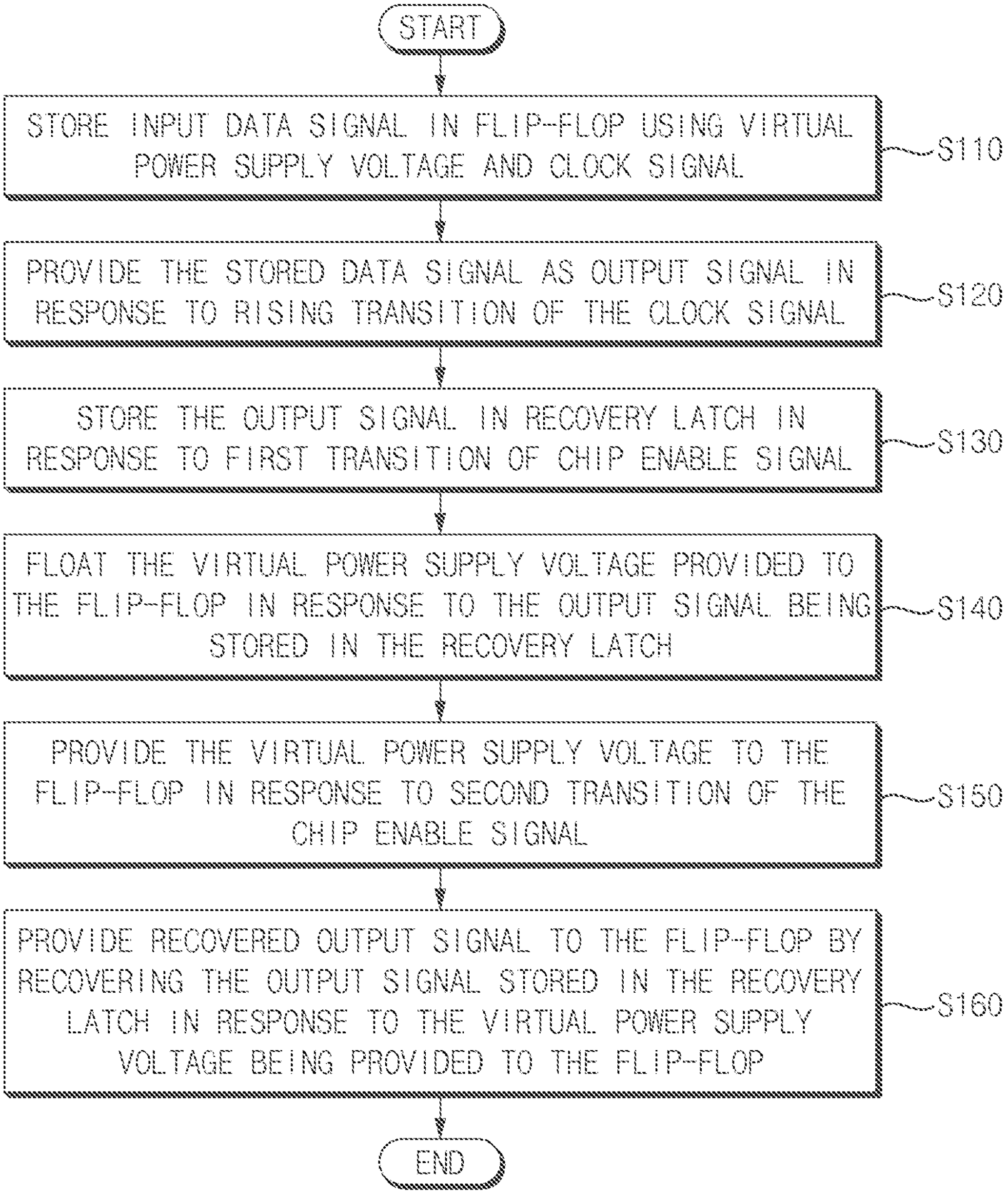
FIG. 21 is a flow chart illustrating a method of operating a data flip-flop circuit according to example embodiments.

FIG. 21 is a flow chart illustrating a method of operating a data flip-flop circuit according to example embodiments.

Referring to FIGS. 12 through 21, there is provided a method of operating a data flip-flop circuit 400*a* which includes a flip-flop 420 operating based on a virtual power supply voltage VVDD and a virtual ground voltage VVSS and a recovery latch 460 operating based on a power supply voltage VDD and a ground voltage VSS.

According to the method, an input data signal DI is stored in the flip-flop 420 using the virtual power supply voltage VVDD and a clock signal CLK (operation S110). The flip-flop 420 provides the stored data signal DI as an output signal Q at an output node NO in response to a rising transition of the clock signal CLK (operation S120).

The output signal Q is stored in the recovery latch 460 connected to the output node NO in response to a first transition to a deactivation of a chip enable signal nCE (operation S130). The virtual power supply voltage VVDD provided to the flip-flop 420 in response to the output signal Q being stored in the recovery latch 460 (operation S140).

The virtual power supply voltage VVDD is provided to the flip-flop 420 in response to a second transition to an activation of the chip enable signal nCE (operation S150). A recovered output signal RVDT1 is provided to the flip-flop 420 by recovering the output signal Q stored in the recovery latch 460 in response to the virtual power supply voltage VVDD being provided to the flip-flop 420 (operation S160).

Figure 22:
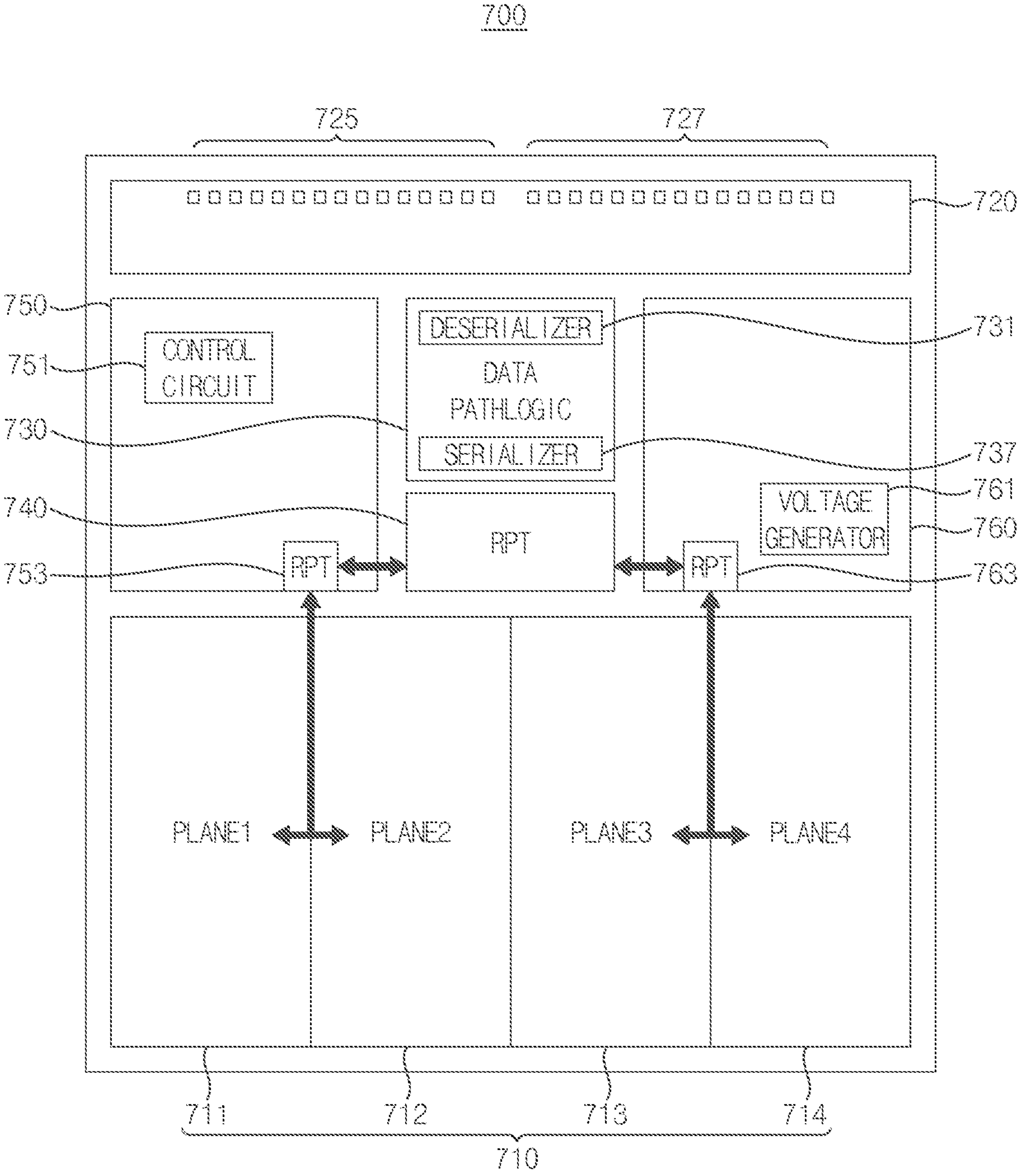
FIG. 22 is a block diagram illustrating an example of a nonvolatile memory device according to example embodiments.

FIG. 22 is a block diagram illustrating an example of a nonvolatile memory device according to example embodiments.

FIG. 22 illustrates an internal layout of a nonvolatile memory device 700.

Referring to FIG. 22, the nonvolatile memory device 700 may include a plurality of memory planes PLANE1 711, PLANE2 712, PLANE3 713 and PLANE4 714. Each of the memory planes 711, 712, 713 and 714 may include a plurality of memory blocks. Each of the memory planes 711, 712, 713 and 714 may form a memory cell array 710. A peripheral region may be formed adjacent to one side of the memory cell array 710. The peripheral region may include a data path logic 730, a repeater RPT 740, a first region 750, a second region 760, and so forth. An interface region 720 may be formed adjacent to one side of the peripheral region. The first region may include a control circuit 751 and the second region 760 may include a voltage generator 761.

The data path logic 730 may be disposed between the interface region 720 and the memory cell array 710. The data path logic 730 may include a deserializer 731 and a serializer 737 which are referred to as a 'SERDES', and may receive data from data I/O pads 725 and 727 included in the interface region 720 or output data to the data I/O pads 725 and 727. Each of the deserializer 731 and the serializer 737 may employ the data flip-flop circuit 400*a* of FIG. 14A.

In example embodiments, the memory cell array 710 may be provided in the first semiconductor layer L1 in FIG. 3 and the peripheral region may be provided in the second semiconductor layer L2 in FIG. 3.

Referring to FIG. 22, data transmission from the repeater 740 is designated by arrows. If data is inputted through the data I/O pads 725 and 727 in the interface region 720, the data is transmitted to the data path logic 730. The data is processed by the SERDES and then transmitted to the repeater 740. The repeater 740 may transmit data to a repeater 753 in the first region 750 or a repeater 763 in the second region 760. The repeaters 753 and 763 may transmit the received data to the memory planes 711, 712, 713 and 714 in the memory cell array 710. Data transmitted from the memory planes 711, 712, 713 and 714 may be transmitted to the I/O pads 725 and 727 of the interface region 720 in a reverse direction of the above-mentioned process.

Figure 23:
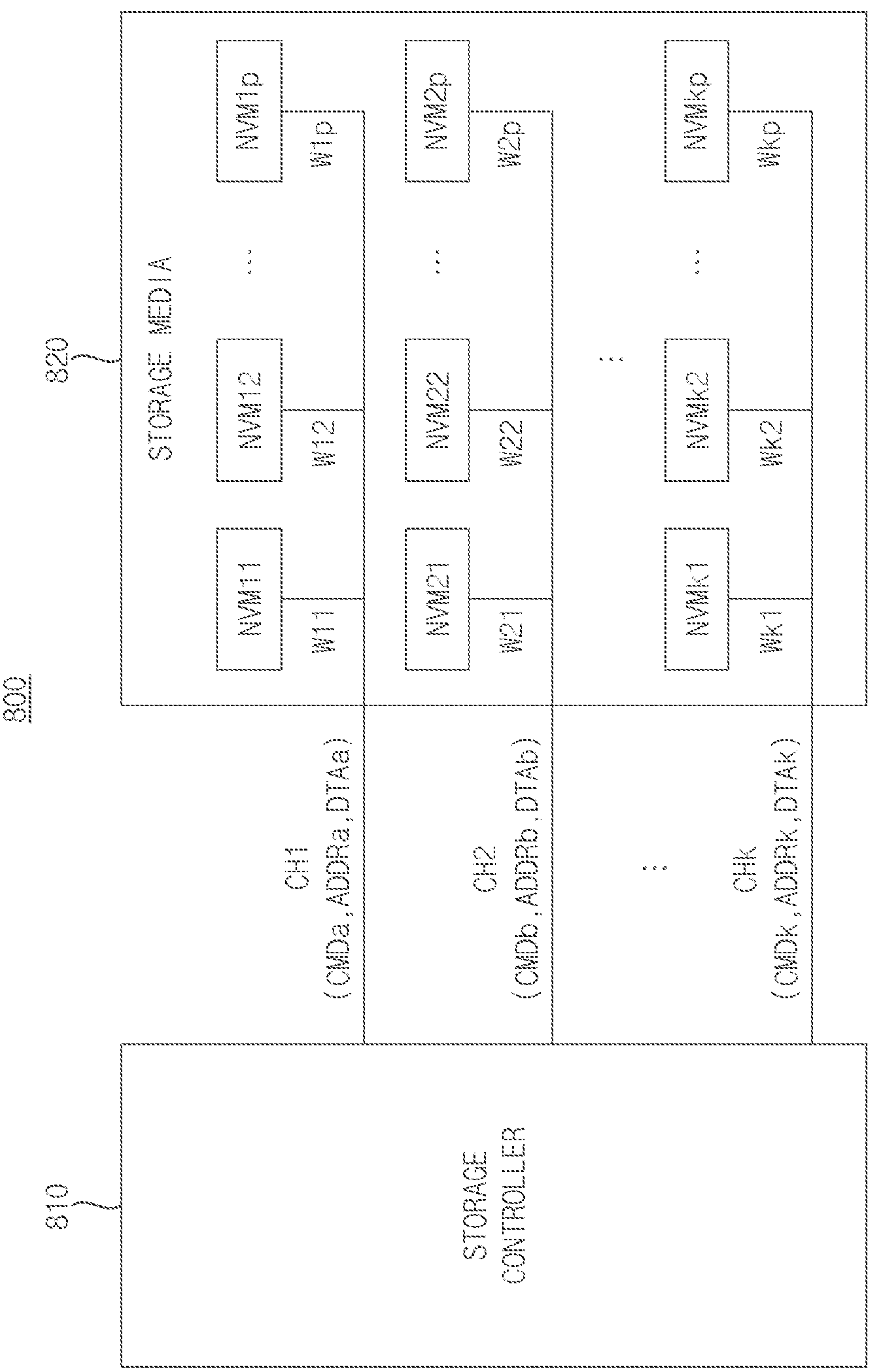
FIG. 23 is a block diagram illustrating a storage device according to example embodiments.

FIG. 23 is a block diagram illustrating a storage device according to example embodiments.

Referring to FIG. 23, a storage device 800 may include a storage controller 810 and a storage media 820. The storage device 800 may support a plurality of channels CH1, CH2, . . . , CHk, and the storage media 820 may be connected to the storage controller 810 through the plurality of channels CH1 to CHk.

The storage media 820 may include a plurality of nonvolatile memory devices NVM11, NVM12, . . . , NVM1*s*, NVM21, NVM22, . . . , NVM2*s*, NVMk1, NVMk2, . . . , NVMkp. For example, each of the nonvolatile memory devices NVM11 to NVMkp may correspond to the nonvolatile memory device 500 of FIG. 1. Each of the nonvolatile memory devices NVM11 to NVMkp may be connected to one of the plurality of channels CH1 to CHk through a way corresponding thereto. For instance, the nonvolatile memory devices NVM11 to NVMIs may be connected to the first channel CH1 through ways W11, W12, . . . , W1*p*, the nonvolatile memory devices NVM21 to NVM2*p* may be connected to the second channel CH2 through ways W21, W22, . . . , W2*p*, and the nonvolatile memory devices NVMk1 to NVMkp may be connected to the k-th channel CHk through ways Wk1, Wk2, Wkp. In some example embodiments, each of the nonvolatile memory devices NVM11 to NVMkp may be implemented as an arbitrary memory unit that may operate according to an individual command from the storage controller 810. For example, each of the nonvolatile memory devices NVM11 to NVMkp may be implemented as a chip or a die, but example embodiments are not limited thereto.

The storage controller 810 may transmit and receive signals to and from the storage media 820 through the plurality of channels CH1 to CHk. For example, the storage controller 810 may correspond to the memory controller 20 in FIG. 1. For example, the storage controller 810 may transmit commands CMDa, CMDb, . . . , CMDk, addresses ADDRa, ADDRb, . . . , ADDRk and data DTAa, DTAb, . . . , DTAK to the storage media 820 through the channels CH1 to CHk or may receive the DTAa to DTAk from the storage media 820.

The storage controller 810 may select one of the nonvolatile memories NVM11 to NVMkp, which is connected to each of the channels CH1 to CHk, by using a corresponding one of the channels CH1 to CHk, and may transmit and receive signals to and from the selected nonvolatile memory device. For example, the storage controller 810 may select the nonvolatile memory NVM11 from among the nonvolatile memories NVM11 to NVMIp connected to the first channel CH1. The storage controller 810 may transmit the command CMDa, the address ADDRa and the DTAa to the selected nonvolatile memory device NVM11 through the first channel CH1 or may receive the DTAa from the selected nonvolatile memory device NVM11.

The storage controller 810 may transmit and receive signals to and from the storage media 820 in parallel through different channels.

Figure 24:
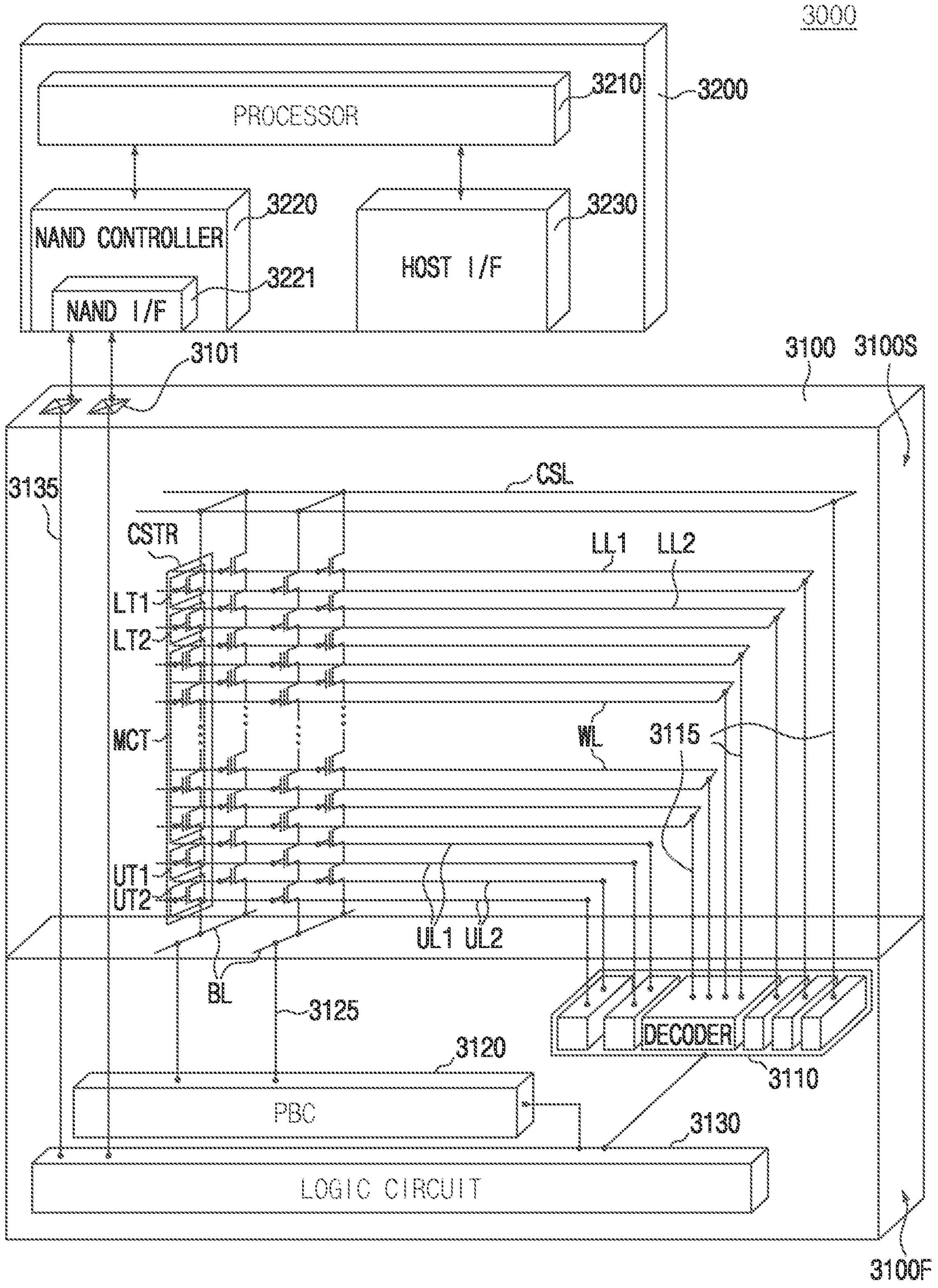
FIG. 24 is a block diagram illustrating an electronic system including a semiconductor device according to example embodiments.

FIG. 24 is a block diagram illustrating an electronic system including a semiconductor device according to example embodiments.

Referring to FIG. 24, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be a non-volatile memory device, for example, a nonvolatile memory device that is explained with reference to FIGS. 1, 3 and 6 through 10. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and (memory) cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 3115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

Figure 25:
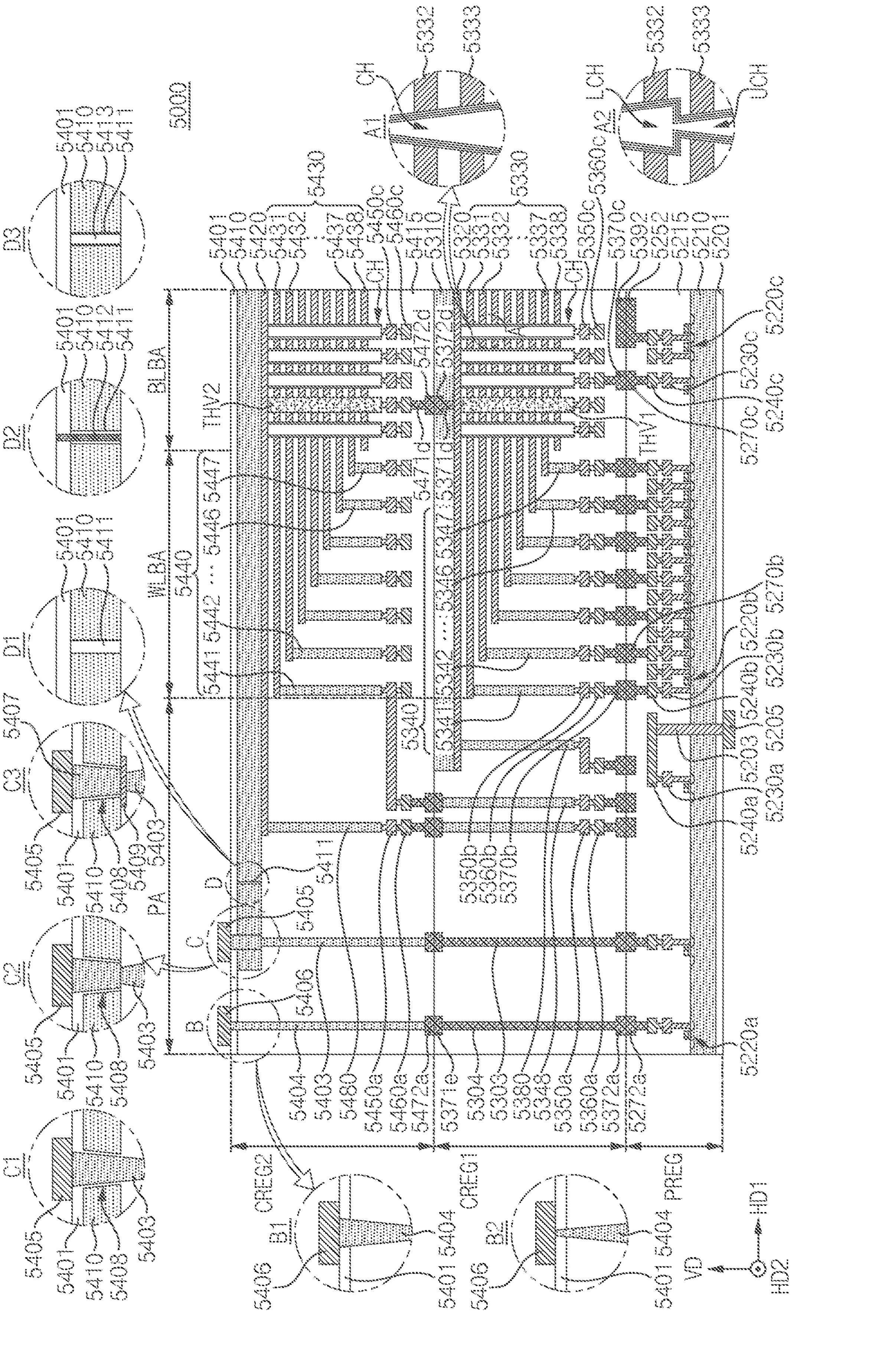
FIG. 25 is a cross-sectional view of a nonvolatile memory device according to example embodiments.

FIG. 25 is a cross-sectional view of a nonvolatile memory device according to example embodiments.

Referring to FIG. 25, a nonvolatile memory device 5000 (which will be referred to as a memory device, hereafter) may have a chip-to-chip (C2C) structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 5000 may include the at least one upper chip including the cell region. For example, as illustrated in FIG. 25, the memory device 5000 may include two upper chips. However, the number of the upper chips is not limited thereto. In the case in which the memory device 5000 includes the two upper chips, a first upper chip including a first cell region CREG1, a second upper chip including a second cell region CREG2 and the lower chip including the peripheral circuit region PREG may be manufactured separately, and then, the first upper chip, the second upper chip and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +third direction VD, and the upper portion of each of the first and second upper chips may mean an upper portion defined based on a −third direction VD in FIG. 25. However, embodiments of the present disclosures are not limited thereto. In certain embodiments, one of the first upper chip and the second upper chip may be turned over and then may be connected to a corresponding chip by the bonding method.

Each of the peripheral circuit region PREG and the first and second cell regions CREG1 and CREG2 of the memory device 5000 may include an external pad bonding region PA, a word-line bonding region WLBA, and a bit-line bonding region BLBA.

The peripheral circuit region PREG may include a first substrate 5210 and a plurality of circuit elements 5220*a*, 5220*b* and 5220*c* formed on the first substrate 5210. An interlayer insulating layer 5215 including one or more insulating layers may be provided on the plurality of circuit elements 5220*a*, 5220*b* and 5220*c*, and a plurality of metal lines electrically connected to the plurality of circuit elements 5220*a*, 5220*b* and 5220*c* may be provided in the interlayer insulating layer 5215. For example, the plurality of metal lines may include first metal lines 5230*a*, 5230*b* and 5230*c* connected to the plurality of circuit elements 5220*a*, 5220*b* and 5220*c*, and second metal lines 5240*a*, 5240*b* and 5240*c* formed on the first metal lines 5230*a*, 5230*b* and 5230*c*. The plurality of metal lines may be formed of at least one of various conductive materials. For example, the first metal lines 5230*a*, 5230*b* and 5230*c* may be formed of tungsten having a relatively high electrical resistivity, and the second metal lines 5240*a*, 5240*b* and 5240*c* may be formed of copper having a relatively low electrical resistivity.

The first metal lines 5230*a*, 5230*b* and 5230*c* and the second metal lines 5240*a*, 5240*b* and 5240*c* are illustrated and described in the present embodiments. However, embodiments of the present disclosures are not limited thereto. In certain embodiments, at least one or more additional metal lines may further be formed on the second metal lines 5240*a*, 5240*b* and 5240*c*. In this case, the second metal lines 5240*a*, 5240*b* and 5240*c* may be formed of aluminum, and at least some of the additional metal lines formed on the second metal lines 5240*a*, 5240*b* and 5240*c* may be formed of copper having an electrical resistivity lower than that of aluminum of the second metal lines 5240*a*, 5240*b* and 5240*c*.

The interlayer insulating layer 5215 may be disposed on the first substrate 5210 and may include an insulating material such as silicon oxide and/or silicon nitride.

Each of the first and second cell regions CREG1 and CREG2 may include at least one memory block. The first cell region CREG1 may include a second substrate 5310 and a common source line 5320. A plurality of word-lines 5330 (5331 to 5338) may be stacked on the second substrate 5310 in a direction (i.e., the third direction VD) perpendicular to a top surface of the second substrate 5310. String selection lines and a ground selection line may be disposed on and under the word-lines 5330, and the plurality of word-lines 5330 may be disposed between the string selection lines and the ground selection line. Likewise, the second cell region CREG2 may include a third substrate 5410 and a common source line 5420, and a plurality of word-lines 5430 (5431 to 5438) may be stacked on the third substrate 5410 in a direction (i.e., the third direction VD) perpendicular to a top surface of the third substrate 5410. Each of the second substrate 5310 and the third substrate 5410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some embodiments, as illustrated in a region ‘A1’, the channel structure CH may be provided in the bit-line bonding region BLBA and may extend in the direction perpendicular to the top surface of the second substrate 5310 to penetrate the word-lines 5330, the string selection lines, and the ground selection line. The channel structure CH may include a data storage layer, a channel layer, and a filling insulation layer. The channel layer may be electrically connected to a first metal line 5350*c* and a second metal line 5360*c* in the bit-line bonding region BLBA. For example, the second metal line 5360*c* may be a bit-line and may be connected to the channel structure CH through the first metal line 5350*c*. The bit-line 5360*c* may extend in a second direction HD2 parallel to the top surface of the second substrate 5310.

In some embodiments, as illustrated in a region ‘A2’, the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 5310 to penetrate the common source line 5320 and lower word-lines 5331 and 5332. The lower channel LCH may include a data storage layer, a channel layer, and a filling insulation layer and may be connected to the upper channel UCH. The upper channel UCH may penetrate upper word-lines 5333 to 5338. The upper channel UCH may include a data storage layer, a channel layer, and a filling insulation layer, and the channel layer of the upper channel UCH may be electrically connected to the first metal line 5350*c* and the second metal line 5360*c*. As a length of a channel increases, due to characteristics of manufacturing processes, it may be difficult to form a channel having a substantially uniform width. The memory device 5000 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region ‘A2’, a word-line located near to a boundary between the lower channel LCH and the upper channel UCH may be a dummy word-line. For example, the word-lines 5332 and 5333 adjacent to the boundary between the lower channel LCH and the upper channel UCH may be the dummy word-lines. In this case, data may not be stored in memory cells connected to the dummy word-line. Alternatively, the number of pages corresponding to the memory cells connected to the dummy word-line may be less than the number of pages corresponding to the memory cells connected to a general word-line. A level of a voltage applied to the dummy word-line may be different from a level of a voltage applied to the general word-line, and thus it is possible to reduce an influence of a non-uniform channel width between the lower and upper channels LCH and UCH on an operation of the memory device.

The number of the lower word-lines 5331 and 5332 penetrated by the lower channel LCH is less than the number of the upper word-lines 5333 to 5338 penetrated by the upper channel UCH in the region ‘A2’. However, embodiments of the present disclosures are not limited thereto. In certain embodiments, the number of the lower word-lines penetrated by the lower channel LCH may be equal to or more than the number of the upper word-lines penetrated by the upper channel UCH. In addition, structural features and connection relation of the channel structure CH disposed in the second cell region CREG2 may be substantially the same as those of the channel structure CH disposed in the first cell region CREG1.

In the bit-line bonding region BLBA, a first through-electrode THV1 may be provided in the first cell region CREG1, and a second through-electrode THV2 may be provided in the second cell region CREG2. As illustrated in FIG. 25, the first through-electrode THV1 may penetrate the common source line 5320 and the plurality of word-lines 5330. In certain embodiments, the first through-electrode THV1 may further penetrate the second substrate 5310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 5372*d* and a second through-metal pattern 5472*d*. The first through-metal pattern 5372*d* may be formed at a bottom end of the first upper chip including the first cell region CREG1, and the second through-metal pattern 5472*d* may be formed at a top end of the second upper chip including the second cell region CREG2. The first through-electrode THV1 may be electrically connected to the first metal line 5350*c* and the second metal line 5360*c*. A lower via 5371*d* may be formed between the first through-electrode THV1 and the first through-metal pattern 5372*d*, and an upper via 5471*d* may be formed between the second through-electrode THV2 and the second through-metal pattern 5472*d*. The first through-metal pattern 5372*d* and the second through-metal pattern 5472*d* may be connected to each other by the bonding method.

In addition, in the bit-line bonding region BLBA, an upper metal pattern 5252 may be formed in an uppermost metal layer of the peripheral circuit region PERI, and an upper metal pattern 5392 having the same shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected to each other by the bonding method. In the bit-line bonding region BLBA, the bit-line 5360*c* may be electrically connected to a page buffer included in the peripheral circuit region PERI. For example, some of the circuit elements 5220*c* of the peripheral circuit region PREG may constitute the page buffer, and the bit-line 5360*c* may be electrically connected to the circuit elements 5220*c* constituting the page buffer through an upper bonding metal pattern 5370*c* of the first cell region CREG1 and an upper bonding metal pattern 5270*c* of the peripheral circuit region PERI.

Referring continuously to FIG. 25, in the word-line bonding region WLBA, the word-lines 5330 of the first cell region CREG1 may extend in a first direction HD1 parallel to the top surface of the second substrate 5310 and may be connected to a plurality of cell contact plugs 5340 (5341 to 5347). First metal lines 5350*b* and second metal lines 5360*b* may be sequentially connected onto the cell contact plugs 5340 connected to the word-lines 5330. In the word-line bonding region WLBA, the cell contact plugs 5340 may be connected to the peripheral circuit region PREG through upper bonding metal patterns 5370*b* of the first cell region CREG1 and upper bonding metal patterns 5270*b* of the peripheral circuit region PERI.

The cell contact plugs 5340 may be electrically connected to a row decoder included in the peripheral circuit region PERI. For example, some of the circuit elements 5220*b* of the peripheral circuit region PREG may constitute the row decoder, and the cell contact plugs 5340 may be electrically connected to the circuit elements 5220*b* constituting the row decoder through the upper bonding metal patterns 5370*b* of the first cell region CREG1 and the upper bonding metal patterns 5270*b* of the peripheral circuit region PERI. In some embodiments, an operating voltage of the circuit elements 5220*b* constituting the row decoder may be different from an operating voltage of the circuit elements 5220*c* constituting the page buffer. For example, the operating voltage of the circuit elements 5220*c* constituting the page buffer may be greater than the operating voltage of the circuit elements 5220*b* constituting the row decoder.

Likewise, in the word-line bonding region WLBA, the word-lines 5430 of the second cell region CREG2 may extend in the first direction HD1 parallel to the top surface of the third substrate 5410 and may be connected to a plurality of cell contact plugs 5440 (5441 to 5447). The cell contact plugs 5440 may be connected to the peripheral circuit region PREG through an upper metal pattern of the second cell region CREG2 and lower and upper metal patterns and a cell contact plug 5348 of the first cell region CREG1.

In the word-line bonding region WLBA, the upper bonding metal patterns 5370*b* may be formed in the first cell region CREG1, and the upper bonding metal patterns 5270*b* may be formed in the peripheral circuit region PERI. The upper bonding metal patterns 5370*b* of the first cell region CREG1 and the upper bonding metal patterns 5270*b* of the peripheral circuit region PREG may be electrically connected to each other by the bonding method. The upper bonding metal patterns 5370*b* and the upper bonding metal patterns 5270*b* may be formed of aluminum, copper, or tungsten.

In the external pad bonding region PA, a lower metal pattern 5371*e* may be formed in a lower portion of the first cell region CREG1, and an upper metal pattern 5472*a* may be formed in an upper portion of the second cell region CREG2. The lower metal pattern 5371*e* of the first cell region CREG1 and the upper metal pattern 5472*a* of the second cell region CREG2 may be connected to each other by the bonding method in the external pad bonding region PA. Likewise, an upper metal pattern 5372*a* may be formed in an upper portion of the first cell region CREG1, and an upper metal pattern 5272*a* may be formed in an upper portion of the peripheral circuit region PERI. The upper metal pattern 5372*a* of the first cell region CREG1 and the upper metal pattern 5272*a* of the peripheral circuit region PREG may be connected to each other by the bonding method.

Common source line contact plugs 5380 and 5480 may be disposed in the external pad bonding region PA. The common source line contact plugs 5380 and 5480 may be formed of a conductive material such as a metal, a metal compound, and/or doped polysilicon. The common source line contact plug 5380 of the first cell region CREG1 may be electrically connected to the common source line 5320, and the common source line contact plug 5480 of the second cell region CREG2 may be electrically connected to the common source line 5420. A first metal line 5350*a* and a second metal line 5360*a* may be sequentially stacked on the common source line contact plug 5380 of the first cell region CREG1, and a first metal line 5450*a* and a second metal line 5460*a* may be sequentially stacked on the common source line contact plug 5480 of the second cell region CREG2.

Input/output pads 5205, 5405 and 5406 may be disposed in the external pad bonding region PA. Referring to FIG. 25, a lower insulating layer 5201 may cover a bottom surface of the first substrate 5210, and a first input/output pad 5205 may be formed on the lower insulating layer 5201. The first input/output pad 5205 may be connected to at least one of a plurality of the circuit elements 5220*a* disposed in the peripheral circuit region PREG through a first input/output contact plug 5203 and may be separated from the first substrate 5210 by the lower insulating layer 5201. In addition, a side insulating layer may be disposed between the first input/output contact plug 5203 and the first substrate 5210 to electrically isolate the first input/output contact plug 5203 from the first substrate 5210.

An upper insulating layer 5401 covering a top surface of the third substrate 5410 may be formed on the third substrate 5410. A second input/output pad 5405 and/or a third input/output pad 5406 may be disposed on the upper insulating layer 5401. The second input/output pad 5405 may be connected to at least one of the plurality of circuit elements 5220*a* disposed in the peripheral circuit region PREG through second input/output contact plugs 5403 and 5303, and the third input/output pad 5406 may be connected to at least one of the plurality of circuit elements 5220*a* disposed in the peripheral circuit region PREG through third input/output contact plugs 5404 and 5304.

In some embodiments, the third substrate 5410 may not be disposed in a region in which the input/output contact plug is disposed. For example, as illustrated in a region 'B', the third input/output contact plug 5404 may be separated from the third substrate 5410 in a direction parallel to the top surface of the third substrate 5410 and may penetrate an interlayer insulating layer 5415 of the second cell region CREG2 so as to be connected to the third input/output pad 5406. In this case, the third input/output contact plug 5404 may be formed by at least one of various processes.

In some embodiments, as illustrated in a region 'B1', the third input/output contact plug 5404 may extend in the third direction VD, and a diameter of the third input/output contact plug 5404 may become progressively greater toward the upper insulating layer 5401. In other words, a diameter of the channel structure CH described in the region 'A1' may become progressively less toward the upper insulating layer 5401, but the diameter of the third input/output contact plug 5404 may become progressively greater toward the upper insulating layer 5401. For example, the third input/output contact plug 5404 may be formed after the second cell region CREG2 and the first cell region CREG1 are bonded to each other by the bonding method.

In certain embodiments, as illustrated in a region 'B2', the third input/output contact plug 5404 may extend in the third direction VD, and a diameter of the third input/output contact plug 5404 may become progressively less toward the upper insulating layer 5401. In other words, like the channel structure CH, the diameter of the third input/output contact plug 5404 may become progressively less toward the upper insulating layer 5401. For example, the third input/output contact plug 5404 may be formed together with the cell contact plugs 5440 before the second cell region CREG2 and the first cell region CREG1 are bonded to each other.

In certain embodiments, the input/output contact plug may overlap with the third substrate 5410. For example, as illustrated in a region 'C', the second input/output contact plug 5403 may penetrate the interlayer insulating layer 5415 of the second cell region CREG2 in the third direction VD and may be electrically connected to the second input/output pad 5405 through the third substrate 5410. In this case, a connection structure of the second input/output contact plug 5403 and the second input/output pad 5405 may be realized by various methods.

In some embodiments, as illustrated in a region 'C1', an opening 5408 may be formed to penetrate the third substrate 5410, and the second input/output contact plug 5403 may be connected directly to the second input/output pad 5405 through the opening 5408 formed in the third substrate 5410. In this case, as illustrated in the region 'C1', a diameter of the second input/output contact plug 5403 may become progressively greater toward the second input/output pad 5405. However, embodiments of the present disclosures are not limited thereto, and in certain embodiments, the diameter of the second input/output contact plug 5403 may become progressively less toward the second input/output pad 5405.

In certain embodiments, as illustrated in a region 'C2', the opening 5408 penetrating the third substrate 5410 may be formed, and a contact 5407 may be formed in the opening 5408. An end of the contact 5407 may be connected to the second input/output pad 5405, and another end of the contact 5407 may be connected to the second input/output contact plug 5403. Thus, the second input/output contact plug 5403 may be electrically connected to the second input/output pad 5405 through the contact 5407 in the opening 5408. In this case, as illustrated in the region 'C2', a diameter of the contact 5407 may become progressively greater toward the second input/output pad 5405, and a diameter of the second input/output contact plug 5403 may become progressively less toward the second input/output pad 5405. For example, the second input/output contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In certain embodiments illustrated in a region 'C3', a stopper 5409 may further be formed on a bottom end of the opening 5408 of the third substrate 5410, as compared with the embodiments of the region 'C2'. The stopper 5409 may be a metal line formed in the same layer as the common source line 5420. Alternatively, the stopper 5409 may be a metal line formed in the same layer as at least one of the word-lines 5430. The second input/output contact plug 5403 may be electrically connected to the second input/output pad 5405 through the contact 5407 and the stopper 5409.

Like the second and third input/output contact plugs 5403 and 5404 of the second cell region CREG2, a diameter of each of the second and third input/output contact plugs 5303 and 5304 of the first cell region CREG1 may become progressively less toward the lower metal pattern 5371*e* or may become progressively greater toward the lower metal pattern 5371*e*.

In some embodiments, a slit 5411 may be formed in the third substrate 5410. For example, the slit 5411 may be formed at a certain position of the external pad bonding region PA. For example, as illustrated in a region 'D', the slit 5411 may be located between the second input/output pad 5405 and the cell contact plugs 5440 when viewed in a plan view. Alternatively, the second input/output pad 5405 may be located between the slit 5411 and the cell contact plugs 5440 when viewed in a plan view.

In some embodiments, as illustrated in a region 'D1', the slit 5411 may be formed to penetrate the third substrate 5410. For example, the slit 5411 may be used to prevent the third substrate 5410 from being finely cracked when the opening 5408 is formed. However, embodiments of the present disclosures are not limited thereto, and in certain embodiments, the slit 5411 may be formed to have a depth ranging from about 60% to about 70% of a thickness of the third substrate 5410.

In certain embodiments, as illustrated in a region 'D2', a conductive material 5412 may be formed in the slit 5411. For example, the conductive material 5412 may be used to discharge a leakage current occurring in driving of the circuit elements in the external pad bonding region PA to the outside. In this case, the conductive material 5412 may be connected to an external ground line.

In certain embodiments, as illustrated in a region 'D3', an insulating material 5413 may be formed in the slit 5411. For example, the insulating material 5413 may be used to electrically isolate the second input/output pad 5405 and the second input/output contact plug 5403 disposed in the external pad bonding region PA from the word-line bonding region WLBA. Since the insulating material 5413 is formed in the slit 5411, it is possible to prevent a voltage provided through the second input/output pad 5405 from affecting a metal layer disposed on the third substrate 5410 in the word-line bonding region WLBA.

In certain embodiments, the first, second, and third input/output pads 5205, 5405 and 5406 may be selectively formed. For example, the memory device 5000 may be realized to include only the first input/output pad 5205 disposed on the first substrate 5210, to include only the second input/output pad 5405 disposed on the third substrate 5410, or to include only the third input/output pad 5406 disposed on the upper insulating layer 5401.

In some embodiments, at least one of the second substrate 5310 of the first cell region CREG1 or the third substrate 5410 of the second cell region CREG2 may be used as a sacrificial substrate and may be completely or partially removed before or after a bonding process. An additional layer may be stacked after the removal of the substrate. For example, the second substrate 5310 of the first cell region CREG1 may be removed before or after the bonding process of the peripheral circuit region PREG and the first cell region CREG1, and then, an insulating layer covering a top surface of the common source line 5320 or a conductive layer for connection may be formed. Likewise, the third substrate 5410 of the second cell region CREG2 may be removed before or after the bonding process of the first cell region CREG1 and the second cell region CREG2, and then, the upper insulating layer 5401 covering a top surface of the common source line 5420 or a conductive layer for connection may be formed.

Figure 26:
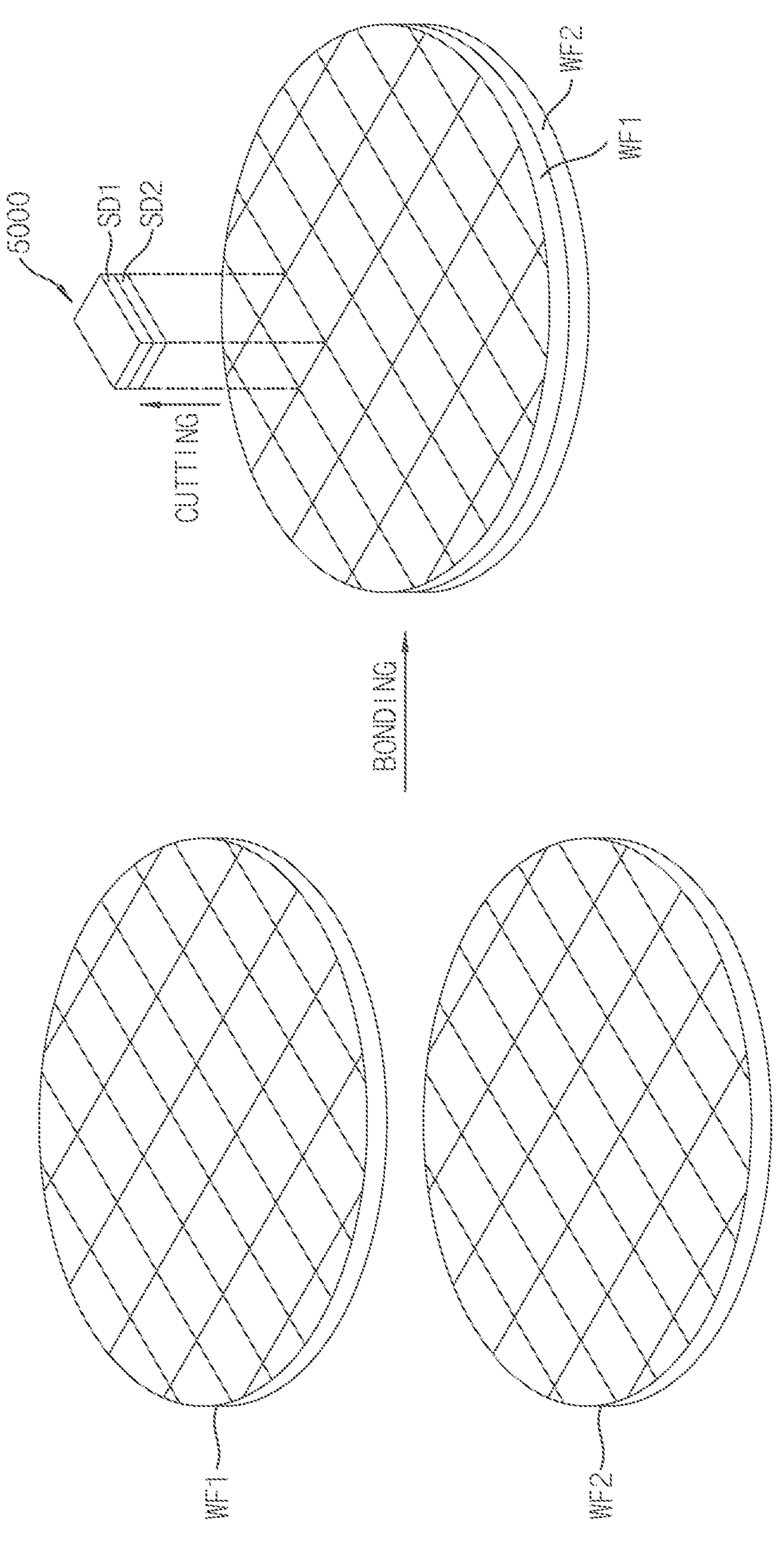
FIG. 26 is a conceptual diagram illustrating manufacturing processes of a stacked semiconductor device according to example embodiments.

FIG. 26 is a conceptual diagram illustrating manufacturing processes of a stacked semiconductor device according to example embodiments.

Referring to FIG. 26, respective integrated circuits may be formed on a first wafer WF1 and a second wafer WF2. The memory cell array may be formed in the first wafer WF1 and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into separate chips, in which each chip corresponds to a semiconductor device such as, for example, the nonvolatile memory device 5000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to the second semiconductor die SD2.

A nonvolatile memory device or a storage device according to example embodiments may be packaged using various package types or package configurations.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A data flip-flop circuit of a nonvolatile memory device, the data flip-flop circuit comprising:
- a flip-flop configured to:
  - store a data signal that is input, using a clock signal and a virtual power supply voltage based on a power supply voltage, and
  - provide the stored data signal as an output signal at an output node in response to a rising transition of the clock signal;
- a recovery latch connected to the power supply voltage and a ground voltage, and connected to the flip-flop at the output node, wherein the recovery latch is configured to:
  - store the output signal internally in response to an activation of a first enable signal based on a first transition corresponding to a deactivation of a chip enable signal,
  - recover the stored output signal in response to an end of a power gating interval based on a second transition corresponding to an activation of the chip enable signal, and provide the recovered output signal to the flip-flop in response to an activation of a second enable signal based on the second transition of the chip enable signal; and
- a first cut-off transistor configured to, in response to the recovery latch storing the output signal, float the virtual power supply voltage provided to the flip-flop based on a first power gating signal during the power gating interval.

2. The data flip-flop circuit of claim 1, wherein the recovery latch is separated from the output node during the chip enable signal being activated.

3. The data flip-flop circuit of claim 1, wherein the recovery latch is further configured to output the stored output signal as a monitoring data during a first time interval during which the chip enable signal is deactivated.

4. The data flip-flop circuit of claim 1, wherein the recovery latch is further configured to:
- set the flip-flop by providing the recovered output signal to the flip-flop in response to the stored output signal having a logic high level; and
- reset the flip-flop by providing the recovered output signal to the flip-flop in response to the stored output signal having a logic low level.

5. The data flip-flop circuit of claim 1, wherein the recovery latch is further configured to, in response to a third enable signal, output the stored output signal as a monitoring data based on an external command during a first time interval during which the chip enable signal is deactivated.

6. The data flip-flop circuit of claim 1, further comprising:
- a second cut-off transistor configured to float a virtual ground voltage provided to the flip-flop during the power gating interval, in response to a second power gating signal based on the first transition of the chip enable signal, the virtual ground voltage being based on the ground voltage, and
- wherein the recovery latch is further configured to be non-associated with a normal operation of the flip-flop by providing the flip-flop with the recovered output signal having a logic high level during the chip enable signal being activated.

7. The data flip-flop circuit of claim 1, wherein the recovery latch further comprises:
- a first transmission gate connected between the output node and a first node, the first transmission gate being configured to connect the output node to the first node in response to the activation of the first enable signal based on the first transition of the chip enable signal;
- a first inverter connected between the first node and a second node;
- a tristate inverter connected between the second node and the first node, the tristate inverter and the first inverter operating as a latch;
- a second inverter connected between the second node and a third node;
- a first branch circuit connected between the third node and a fourth node, the first branch circuit being configured to output a first logic level of the third node as a first recovered output signal of the recovered output signal, in response to the activation of the second enable signal based on the second transition of the chip enable signal;
- a second branch circuit connected between the second node and a fifth node, the second branch circuit being configured to output a second logic level of the second node as a second recovered output signal of the recovered output signal, in response to the activation of the second enable signal; and
- a third branch circuit connected to the third node in parallel with the first branch circuit, the third branch circuit being configured to output the first logic level of the third node as a monitoring data in response to a third enable signal based on an external command during a first time interval during which the chip enable signal is deactivated.

8. The data flip-flop circuit of claim 7, wherein the first branch circuit comprises:
- a second transmission gate connected between the third node and the fourth node, the second transmission gate being configured to transfer an output of the second inverter to the fourth node in response to the activation of the second enable signal; and
- a first precharge transistor connected between the power supply voltage and the fourth node, the first precharge transistor being configured to precharge the fourth node with a logic high level in response to the deactivation of the second enable signal, and
- wherein the second branch circuit comprises:
- a third transmission gate connected to the second node, the third transmission gate being configured to transfer an output of the first inverter to the fifth node in response to the activation of the second enable signal; and a second precharge transistor connected between the power supply voltage and the fifth node, the second precharge transistor being configured to precharge the fifth node with the logic high level in response to the deactivation of the second enable signal.

9. The data flip-flop circuit of claim 7, wherein the third branch circuit comprises a second transmission gate connected to the third node, the second transmission gate being configured to output the first logic level of the third node as the monitoring data in response to an activation of the third enable signal.

10. A data flip-flop circuit of a nonvolatile memory device, the data flip-flop circuit comprising:

a flip-flop configured to:

store a data signal that is input, using a clock signal and a virtual power supply voltage based on a power supply voltage, and provide the stored data signal as an output signal at an output node in response to a rising transition of the clock signal;

a recovery latch connected to the power supply voltage and a ground voltage, and connected to the flip-flop at the output node, wherein the recovery latch is configured to:

store the output signal internally in response to a first transition corresponding to a deactivation of a chip enable signal, recover the stored output signal in response to an end of a power gating interval based on a second transition corresponding to an activation of the chip enable signal, and provide the recovered output signal to the flip-flop; and a first cut-off transistor configured to, in response to the recovery latch storing the output signal, float the virtual power supply voltage provided to the flip-flop based on a first power gating signal during the power gating interval, wherein the flip-flop comprises:

a first circuit configured to:

store the data signal, and provide the output signal to the output node in response to the rising transition of the clock signal; and a second circuit configured to provide the recovered output signal to the output node, and wherein the first circuit comprises:

a first inverter configured to output an inverted clock signal by inverting the clock signal, a first transmission gate configured to transfer the data signal to a first node based on the clock signal and the inverted clock signal, a second transmission gate, connected to the first node, configured to transfer an output of the first transmission gate to a second node based on the clock signal and the inverted clock signal, a second inverter that has an output connected to the second node and an input connected to a third node, a third transmission gate, connected to the input of the second inverter at the third node, configured to transfer the input of the second inverter to a fourth node based on the clock signal and the inverted clock signal, and a fourth transmission gate, connected to the fourth node, configured to transfer an output of the third transmission gate to the output node as the output signal based on the clock signal and the inverted clock signal.

11. The data flip-flop circuit of claim 10, wherein the second circuit comprises:

a first NAND gate connected to the first node and configured to perform a first NAND operation on the output of the first transmission gate and a first recovered output signal of the recovered output signal;

a second NAND gate configured to perform a second NAND operation on the output of the first NAND gate and a second recovered output signal of the recovered output signal, the second NAND gate having an output connected to the third node;

a third NAND gate connected to the fourth node and configured to perform a third NAND operation on the output of the third transmission gate and the first recovered output signal; and a fourth NAND gate configured to perform a fourth NAND operation on the output of the third NAND gate and the second recovered output signal, the fourth NAND gate having an output connected to the output node.

12. A nonvolatile memory device comprising:

a data flip-flop circuit disposed in a data transfer path of the nonvolatile memory device; and a control circuit configured to control the data flip-flop circuit, wherein the data flip-flop circuit comprises:

a flip-flop configured to:

store a data signal that is input, using a clock signal and a virtual power supply voltage based on a power supply voltage, and provide the stored data signal as an output signal at an output node in response to a rising transition of the clock signal;

a recovery latch connected to the power supply voltage and a ground voltage and connected to the flip-flop at the output node, wherein the recovery latch is configured to:

store the output signal internally in response to a first transition to a deactivation of a chip enable signal, recover the stored output signal in response to an end of a power gating interval based on a second transition to an activation of the chip enable signal, and provide the recovered output signal to the flip-flop;

a first cut-off transistor configured to, in response to the recovery latch storing the output signal, float the virtual power supply voltage provided to the flip-flop based on a first power gating signal during the power gating interval; and a second cut-off transistor configured to, in response to a second power gating signal based on the first transition of the chip enable signal, float a virtual ground voltage provided to the flip-flop during the power gating interval, the virtual ground voltage being based on the ground voltage, and wherein the control circuit comprises:

a timing controller configured to generate timing control signals for controlling the recovery latch based on a command, the first power gating signal and the chip enable signal; and a power gating controller configured to generate the first power gating signal and the second power gating signal based on the chip enable signal and the timing control signals.

* * * * *